United States Patent
Hidaka

(10) Patent No.: US 7,292,470 B2
(45) Date of Patent: Nov. 6, 2007

(54) THIN FILM MAGNETIC MEMORY DEVICE WRITING DATA WITH BIDIRECTIONAL CURRENT

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/607,893

(22) Filed: Dec. 4, 2006

(65) Prior Publication Data

US 2007/0076472 A1    Apr. 5, 2007

Related U.S. Application Data

(60) Continuation of application No. 11/348,359, filed on Feb. 7, 2006, now Pat. No. 7,154,776, which is a division of application No. 10/328,032, filed on Dec. 26, 2002, now Pat. No. 7,020,008, which is a continuation-in-part of application No. 10/166,784, filed on Jun. 12, 2002, now abandoned.

(30) Foreign Application Priority Data

Dec. 26, 2001 (JP) ............................. 2001-394285
Oct. 1, 2002   (JP) ............................. 2002-288755

(51) Int. Cl.
*G11C 11/14* (2006.01)
*G11C 5/08* (2006.01)
*G11C 11/00* (2006.01)
*G11C 7/00* (2006.01)
*G11C 8/00* (2006.01)

(52) U.S. Cl. .................. 365/171; 365/66; 365/154; 365/189.11; 365/230.06

(58) Field of Classification Search .................. 365/66, 365/154, 171, 173
See application file for complete search history.

(56) References Cited

U.S. PATENT DOCUMENTS 5,970,019 A * 10/1999 Suzuki et al. ........... 365/230.06
2001/0053091 A1* 12/2001 Futatsuya et al. ....... 365/185.11

* cited by examiner

*Primary Examiner*—Ly Duy Pham
(74) *Attorney, Agent, or Firm*—McDermott Will & Emery LLP

(57) ABSTRACT

An end of a selected bit line in a selected column is electrically coupled to an end of a corresponding current return line by one of first and second write column select gates, which are selectively turned on in response to results of column selection. A data write circuit sets the other end of the selected bit line and the other end of the current return line to one and the other of a power supply voltage and a ground voltage in accordance with a level of write data via one of first and second data buses and an inverted data bus, respectively.

5 Claims, 22 Drawing Sheets

THIN FILM MAGNETIC MEMORY DEVICE WRITING DATA WITH BIDIRECTIONAL CURRENT

RELATED APPLICATION

This application is a continuation of Application Ser. No. 11/348,359, filed Feb. 7, 2006, now U.S. Pat. No. 7,154,776, which is a divisional of Application Ser. No. 10/328,032, filed Dec. 26, 2002, now U.S. Pat. No. 7,020,008, which claims priority of Japanese Application No. 2002-288755, filed Oct. 1, 2002. Application Ser. No. 10/328,032, filed Dec. 26, 2002 is also a Continuation-In-Part of U.S. patent application Ser. No. 10/166,784, filed Jun. 12, 2002 which claims priority of Japanese Application No. 2001-394285, filed Dec. 26, 2001, the contents of which are hereby incorporated by reference.

BACKGROUND OF THE INVENTION

1. Field of the Invention

The present invention relates to a thin film magnetic memory device, and particularly to a thin film magnetic memory device provided with memory cells having MTJs (Magnetic Tunnel Junctions)

2. Description of the Background Art

Attention is being given to an MRAM (Magnetic Random Access Memory) device as a memory device, which can nonvolatilely store data with low power consumption. The MRAM device is a memory device, in which a plurality of thin film magnetic members are formed in a semiconductor integrated circuit for nonvolatilely storing data, and random access to each thin film magnetic member is allowed.

Particularly, in recent years, it has been announced that a performance of the MRAM device can be dramatically improved by using the thin film magnetic members, which utilize the MTJs (magnetic tunnel junctions), as memory cells. The MRAM device with memory cells having the magnetic tunnel junctions has been disclosed in technical references such as "A 10 ns Read and Write Non-Volatile Memory Array Using a Magnetic Tunnel Junction and FET Switch in each Cell", ISSCC Digest of Technical Papers, TA7.2, February 2000, "Nonvolatile RAM based on Magnetic Tunnel Junction Elements", ISSCC Digest of Technical Papers, TA7.3, February 2000, and "A 256 kb 3.0V 1T1MTJ Novolatile Magneto-resistance RAM", ISSCC Digest of technical Papers, TA7.6, February 2001.

FIG. 21 conceptually shows a structure of a memory cell, which has a magnetic tunnel junction, and may be merely referred to as an "MTJ memory cell" hereinafter.

Referring to FIG. 21, an MTJ memory cell includes a tunneling magneto-resistance element TMR having an electric resistance, which is variable in accordance with a level of storage data, and an access element ATR for forming a path of a data read current Is passing through tunneling magneto-resistance element TMR in a data read operation. Access element ATR is typically formed of a field-effect transistor, and therefore may be referred to as an "access transistor ATR" hereinafter. Access transistor ATR is coupled between tunneling magneto-resistance element TMR and a fixed voltage (ground voltage GND).

For the MTJ memory cell, the structure includes a write word line WWL for instructing data writing, a read word line RWL for executing data reading and a bit line BL, which is a data line for transmitting an electric signal in accordance with the data level of the storage data.

FIG. 22 conceptually shows an operation of reading data from the MTJ memory cell.

Referring to FIG. 22, tunneling magneto-resistance element TMR has a ferromagnetic material layer, which has a fixed and uniform magnetization direction, and may be merely referred to as a "fixed magnetic layer" hereinafter, and a ferromagnetic material layer VL, which is magnetized in a direction depending on an externally applied magnetic field, and may be merely referred to as a "free magnetic layer" hereinafter. A tunneling barrier (tunneling film) TB formed of an insulator film is disposed between fixed magnetic layer FL and free magnetic layer VL. Free magnetic layer VL is magnetized in the same direction as fixed magnetic layer FL or in the opposite direction in accordance with the level of the storage data to be written. Fixed magnetic layer FL, tunneling barrier TB and free magnetic layer VL form a magnetic tunnel junction.

In the data read operation, access transistor ATR is turned on in response to activation of read word line RWL. Thereby, data read current Is can flow through a current path formed of bit line BL, tunneling magneto-resistance element TMR, access transistor ATR and ground voltage GND.

Tunneling magneto-resistance element TMR has an electric resistance, which is variable depending on a correlation in magnetization direction between fixed magnetic layer FL and free magnetic layer VL. More specifically, when the fixed magnetic layer FL and free magnetic layer VL are magnetized in the same (parallel) direction, the electric resistance of tunneling magneto-resistance element TMR is smaller than that in the case where these layers FL and VL are magnetized in the opposite directions (parallel opposite directions), respectively.

Accordingly, by magnetizing free magnetic layer VL in a direction depending on the storage data, the voltage change caused in tunneling magneto-resistance element TMR by data read current Is changes depending on the storage data level. For example, if data read current Is is passed through tunneling magneto-resistance element TMR after precharging bit line BL to a predetermined voltage, the storage data of the MTJ memory cell can be read out by detecting the voltage on bit line BL.

FIG. 23 conceptually shows an operation of writing data in the MTJ memory cell.

Referring to FIG. 23, read word line RWL is inactive, and access transistor ATR is turned off in the data write operation. In this state, the data write currents for magnetizing free magnetic layer VL in the direction depending on the level of the write data are supplied to write word line WWL and bit line BL, respectively. The magnetization direction of free magnetic layer VL depends on the respective data write currents flowing through write word line WWL and bit line BL.

FIG. 24 conceptually shows a relationship between the data write current and the magnetization direction of the tunneling magneto-resistance element in the data write operation for the MTJ memory cell.

Referring to FIG. 24, an abscissa H(EA) gives a magnetic field, which is applied in an easy axis (EA) to free magnetic layer VL of tunneling magneto-resistance element TMR. An ordinate H(HA) indicates a magnetic field acting in a hard axis (HA) on free magnetic layer VL. Magnetic fields H(EA) and H(HA) correspond to two magnetic fields produced by currents flowing through bit line BL and write word line WWL, respectively.

In the MTJ memory cell, the fixed magnetization direction of fixed magnetic layer FL is parallel to the easy axis of free magnetic layer VL, and free magnetic layer VL is magnetized in the magnetization easy direction, and particularly in the same parallel direction, which is the same direction as fixed magnetic layer FL, or in the opposite parallel direction, which is opposite to the above direction, depending on the level ("1" or "0") of the storage data. In the following description, the electric resistances of tunneling magneto-resistance element TMR, which correspond to the two magnetization directions of free magnetic layer VL, are indicated by R1 and R0 (R1>R0), respectively. The MTJ memory cell can selectively store data ("1" and "0") of one bit corresponding to the two magnetization directions of free magnetic layer VL.

The magnetization direction of free magnetic layer VL can be rewritten only when a sum of applied magnetic fields H(EA) and H(HA) falls within a region outside an asteroid characteristic line shown in FIG. 18. Therefore, the magnetization direction of free magnetic layer VL does not switch when the data write magnetic fields applied thereto have intensities corresponding to a region inside the asteroid characteristic line.

As can be seen from the asteroid characteristic line, the magnetization threshold required for changing the magnetization direction along the magnetization easy shaft can be lowered by applying the magnetic field in the direction of the hard axis to free magnetic layer VL.

When the operation point in the data write operation is designed, for example, as shown in FIG. 24, the data write magnetic field in the MTJ cell selected as a data write target is designed such that the data write magnetic field in the direction of the easy axis has an intensity of $H_{WR}$. Thus, the data write current flowing through bit line BL or write word line WWL is designed to take a value, which can provide the data write magnetic field of $H_{WR}$. In general, data write magnetic field $H_{WR}$ is represented by a sum of a switching magnetic field $H_{SW}$ required for switching the magnetization direction and a margin $\Delta H$. Thus, it is represented by an expression of $H_{WR}=H_{SW}+\Delta H$.

For rewriting the storage data of the MTJ memory cell, i.e., the magnetization direction of tunneling magneto-resistance element TMR, it is necessary to pass the data write currents at a predetermined level or higher through write word line WWL and bit line BL. Thereby, free magnetic layer VL in tunneling magneto-resistance element TMR is magnetized in the same parallel direction as fixed magnetic layer FL or opposite parallel direction in accordance with the direction of the data write magnetic field along the easy axis (EA). The magnetization direction, which was once written into tunneling magneto-resistance element TMR, and thus the storage data of MTJ memory cell is held nonvolatilely until next data writing is executed.

As described above, the electric resistance of tunneling magneto-resistance element TMR is variable in accordance with the magnetization direction, which is rewritable by the data write magnetic field applied thereto. Therefore, nonvolatile data storage can be executed by establishing a correlation between two magnetization directions of free magnetic layer VL in tunneling magneto-resistance element TMR and levels ("1" and "0") of the storage data.

In the data write operation of the MRAM device, as described above, it is necessary to switch the magnetization direction of tunneling magneto-resistance element TMR in the MTJ memory cell, which is selected as a data write target. Therefore, it is necessary to control the directions of the data write currents flowing through write word line WWL and bit line BL in accordance with the level of the write data. This complicates a structure of a circuit system supplying the data write current, and increases a chip size of the MRAM device.

SUMMARY OF THE INVENTION

An object of the invention is to provide a structure of a thin film magnetic memory device, which has a simple circuit structure, and can supply a data write current corresponding to a write data level.

In summary, a thin film magnetic memory device according to the invention includes a plurality of memory cells arranged in rows and columns, and each storing data written in response to application of first and second data write magnetic fields; a plurality of write word lines provided corresponding to the rows for passing in a predetermined direction a first data write current producing the first data write magnetic field in a selected row, respectively; a plurality of bit lines provided corresponding to the columns for passing, in a direction in accordance with a write data, a second data write current producing the second data write magnetic field in a selected column, respectively; and a plurality of current return lines arranged in the same direction as the plurality of bit lines. Each of the bit lines corresponds to one of the plurality of current return lines. The second data write current flows through a selected bit line corresponding to the selected column and the corresponding current return line having an end on one side electrically coupled to an end on one side of the selected bit line corresponding to the selected column.

Accordingly, the invention can provide such advantages in the thin film magnetic memory device that each bit line and the corresponding current return line are coupled together at the ends on one, and the direction of the current flowing through the selected bit line can be controlled by setting the voltages on the other end sides of the selected bit line and the corresponding current return line. Consequently, it is possible to simplify a circuit structure for controlling the direction of the data write current in accordance with the write data level.

According to another aspect of the invention, a thin film magnetic memory device includes a plurality of memory cells arranged in rows and columns, and each storing data written in response to application of first and second data write magnetic fields; a plurality of write word lines provided corresponding to the rows for passing in a predetermined direction a first data write current producing the first data write magnetic field in a selected row, respectively; a plurality of bit lines provided corresponding to the columns for passing, in a direction in accordance with a write data, a second data write current producing the second data write magnetic field in a selected column, respectively; a plurality of first column select lines each provided for every K columns (K: integer larger than one) forming one column block and corresponding to different column addresses, respectively; second column select lines of K in number for selecting one of the corresponding K columns in each column block; a column decoder for selectively activating one of the plurality of first column select lines and one of the second column select lines of K in number in accordance with results of the column selection; and a data write circuit for operating in accordance with the first and second column select lines to set one and the other end portions of the selected bit line corresponding to the selected column to one and the other of the first and second voltages in accordance with the write data, respectively.

According to the thin film magnetic memory device described above, the column selection is executed by a combination of the selection of the column blocks each formed of the plurality of memory cell columns and the selection of the memory cell column in each column block. Therefore, it is possible to reduce the number of signal interconnections required for the column selection.

According to still another aspect of the invention, a thin film magnetic memory device includes a plurality of memory cells arranged in rows and columns, and each storing data written in response to application of first and second data write magnetic fields; a plurality of write word lines provided corresponding to the rows for passing in a predetermined direction a first data write current producing the first data write magnetic field in a selected row, respectively; a plurality of first bit lines provided corresponding to the columns, respectively; and a data write circuit for passing, in a direction in accordance with a write data, a second data write current producing the second data write magnetic field through a portion, corresponding a selected memory cell, of selected one of the first bit lines corresponding to a selected column. The data write circuit includes a plurality of bit line drive portions provided for each of the columns and arranged corresponding to a first node corresponding to one end portion of the corresponding first bit line, a second node corresponding to the other end portion of the corresponding first bit line and an at least one intermediate node of the corresponding first bit line, respectively. The two bit line drive portions included in the plurality of bit line drive portions in the selected column and located on opposite sides of the selected memory cell set the corresponding nodes of the first bit line to one and the other of first and second voltages corresponding to the write data.

According to the thin film magnetic memory device described above, it is possible to pass the data write current only through a partial section, which corresponds to the selected memory cell, of the selected bit line. Therefore, an electric resistance of a path of a data write current can be reduced so that the required data write current can be supplied easily even in a low voltage operation, and a speed of the data write operation can be increased. Further, it is possible to suppress erroneous writing of data into an unselected memory cell in the selected column.

According to yet another aspect of the invention, a thin film magnetic memory device includes a plurality of memory cells arranged in rows and columns, and each storing data written in response to application of first and second data write magnetic fields; a plurality of write word lines provided corresponding to the rows for passing in a predetermined direction a first data write current producing the first data write magnetic field in a selected row, respectively; a plurality of bit lines provided corresponding to the columns for passing, in a direction in accordance with a write data, a second data write current producing the second data write magnetic field in a selected column, respectively; and a write word line drive circuit for passing the first data write current through at least a portion of a selected write word line corresponding to the selected row. The write word line drive circuit sets two nodes among a first node corresponding to one end portion, a second node corresponding to the other end portion and at least one intermediate node, of the selected write word line, and located on the opposite sides of a selected memory cell, to one and the other of first and second voltages, respectively.

According to further another aspect of the invention, a thin film magnetic memory device includes a plurality of memory cells arranged in rows and columns, and each storing data written in response to application of first and second data write magnetic fields; and a plurality of write word lines provided corresponding to the rows for passing a first data write current producing the first data write magnetic field in a selected row, respectively. Each write word line is connected via an intermediate node to a first voltage. The thin film magnetic memory device further includes a plurality of bit lines provided corresponding to the columns for passing in a direction in accordance with a write data a second data write current producing the second data write magnetic field in a selected column, respectively; and a write word line drive circuit for passing the first data write current through at least a portion of a selected write word line corresponding to the selected row. The write word line drive circuit includes first and second drive switches provided for each of the rows, and arranged at a first node on one end side and a second node on the other end side, of corresponding one of the write word lines, respectively. In the selected row, one selected from the first and second drive switches in accordance with a positional relationship between the selected memory cell and the intermediate node connects the corresponding node to a second voltage.

According to the thin film magnetic memory device described above, it is possible to pass the data write current only through a partial section, which corresponds to the selected memory cell, of the selected write word line. Therefore, an electric resistance of a path of a data write current can be reduced so that the required data write current can be supplied easily even in a low voltage operation, and a speed of the data write operation can be increased. Further, it is possible to suppress erroneous writing of data into an unselected memory cell.

According to a further aspect of the invention, a thin film magnetic memory device includes a plurality of memory cells arranged in rows and columns, and each storing data written in response to application of first and second data write magnetic fields; a plurality of write word lines provided corresponding to the rows for passing in a predetermined direction a first data write current producing the first data write magnetic field in a selected row, respectively; a plurality of first and second bit lines each provided corresponding to each of the columns for passing, in a direction in accordance with a write data, a second data write current producing the second data write magnetic field in a selected column; select switches provided corresponding to the columns, respectively, for electrically coupling one end portions of corresponding ones of the first and second bit lines corresponding to the selected column; and a data write circuit for setting the other end portions of the first and second bit lines corresponding to the selected column to one and the other of first and second voltages corresponding to a level of the write data, respectively. The first and second bit lines are made of first and second metal interconnections formed at different interconnection layers located higher than the plurality of memory cells, respectively. The first and second bit lines corresponding to the same column crossing each other in a predetermined lengthwise position to change their relative vertical positions.

In the thin film magnetic memory device, the data write currents in the directions corresponding to the write data can be passed as reciprocating currents through the first and second bit lines, which have the end portions on one side electrically connected together. Therefore, it is possible to simplify a circuit structure for controlling the direction of the data write current in accordance with the write data level. Further, the vertically neighboring first and second bit lines carry the currents in the opposite directions, respectively, so that magnetic noises produced from the first and second bit lines in the selected column act to weaken each other in the other memory cells. Accordingly, an influence by the magnetic noises can be reduced, and thereby the erroneous writing of data can be prevented to improve the operation stability.

According to a further aspect of the invention, a thin film magnetic memory device includes a plurality of memory cells arranged in rows and columns, and each storing data written in response to application of first and second data write magnetic fields; a plurality of write word lines provided corresponding to the rows for passing in a predetermined direction a first data write current producing the first data write magnetic field in a selected row, respectively; and a plurality of first and second bit lines each provided corresponding to each of the columns for passing, in a direction in accordance with a write data, a second data write current producing the first data write magnetic field in a selected column. The first and second bit lines are made of first and second metal interconnections formed at different interconnection layers located higher than the plurality of memory cells, respectively. The first and second bit lines corresponding to the same column cross each other in a predetermined lengthwise position to change their relative vertical positions. The thin film magnetic memory device further includes a data write circuit operating in the data write operation to set one end portion selected of one of the first and second bit lines corresponding to the selected column and spaced by a shorter distance from the selected memory cell than the other to one of the first and second voltages in accordance with the write data, and to set the other end portion of the one of the first and second bit lines to the other of the first and second voltages.

In the thin film magnetic memory device described above, the data write current in the direction corresponding to the write data level can be passed by using one of the first and second bit lines in the selected column, which is closer to the selected memory cell than the other. Even in the selected column, therefore, the data write current does not flow through the interconnection, which is close to the memory cell and is located in the region not including the selected memory cell. Consequently, it is possible to suppress erroneous writing of data into an unselected memory cell in the selected column.

According to a further aspect of the invention, a thin film magnetic memory device includes a plurality of memory cells each storing data by being magnetized in a direction corresponding to an applied data write magnetic field; a plurality of bit lines arranged corresponding to predetermined sections of the plurality of memory cells, respectively; and a data write circuit for supplying, in a direction corresponding to write data, a data write current producing the data write magnetic field to at least one of the plurality of bit lines. The data write circuit includes a plurality of first drive circuits arranged corresponding to the plurality of bit lines, respectively, and each configured to drive a voltage on one end side of the corresponding bit line. The plurality of bit lines are divided into a plurality of groups, and each of the plurality of groups has the bit lines of X (X: integer larger than one) in number electrically coupled on the other end side via a short-circuit node. The data write circuit further includes a plurality of second drive circuits arranged corresponding to the plurality of groups for driving voltages on the corresponding short-circuit nodes, respectively. At least one of the plurality of first drive circuits corresponding to a selected memory cell drives the corresponding one end side with one of first and second voltages according to the write data, and at least one of the plurality of second drive circuits corresponding to said selected memory cell drives the corresponding short-circuit node with the other of the first and second voltages according to the write data.

According to the thin film magnetic memory device described above, the layout pitch of the drive circuits corresponding to the other end sides of the bit lines can be increased by a factor of X so that a chip area can be reduced.

According to a further aspect of the invention, a thin film magnetic memory device includes a plurality of memory cells each storing data by being magnetized in a direction corresponding to an applied data write magnetic field; a plurality of bit lines arranged corresponding to predetermined sections of the plurality of memory cells, respectively; and data write circuits for supplying, in a direction corresponding to write data, a data write current producing the data write magnetic field to at least one of the plurality of bit lines. The plurality of bit lines are divided into a plurality of groups. Each of the plurality of groups has the two bit lines having intermediate points coupled together. The data write circuit includes a plurality of first drive circuits arranged corresponding to the plurality of bit lines, respectively, and each configured to drive a voltage on one end side of the corresponding bit line, and a plurality of second drive circuits arranged corresponding to the plurality of bit lines, respectively, and each configured to drive a voltage on the other end side of the corresponding bit line. At least one of the plurality of groups including a selected memory cell is configured such that the corresponding two first drive circuits or the corresponding two second drive circuits drive, on the one end side or the other end side, the corresponding two bit lines to one and the other of first and second voltages in accordance with the write data, respectively.

According to the thin film magnetic memory device described above, the data write current can be passed only through a partial section, corresponding to the selected memory cell, of the bit line in the selected column without requiring a drive circuit arranged on an intermediate point of the bit line. Therefore, increase in chip area can be prevented, and a resistance of a path of a data write current can be reduced so that the required data write current can be supplied easily even in a low voltage operation, and a speed of the data write operation can be increased. Further, it is possible to suppress erroneous writing of data into an unselected memory cell in the selected column The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. In the figures, the same reference numbers or characters indicate the same or corresponding portions.

First Embodiment

Figure 1:
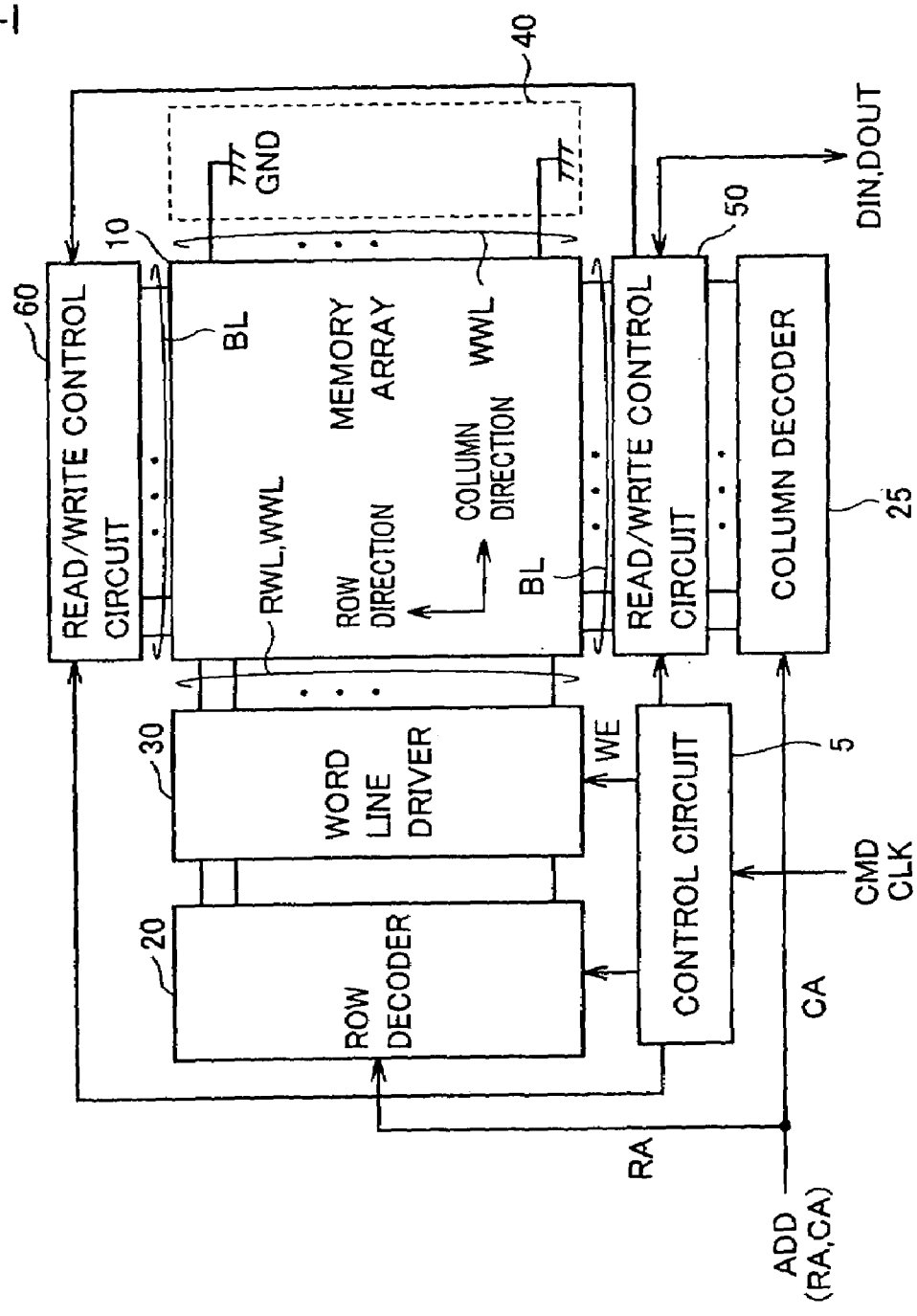
FIG. 1 is a schematic block diagram showing a whole structure of an MRAM device according to a first embodiment of the invention.

Referring to FIG. 1, an MRAM device 1 according to a first embodiment of the invention executes random access in response to a control signal CMD and an address signal ADD, which are externally applied, and executes input of write data DIN or output of read data DOUT. The data read operation and data write operation in MRAM device 1 are executed in accordance with timing, e.g., synchronized with an externally applied clock signal CLK. Alternatively, MRAM device 1 may internally determine the operation timing without receiving externally applied clock signal CLK.

MRAM device 1 includes a control circuit 5 for controlling a whole operation of MRAM device 1 in response to control signal CMD, and a memory array 10 having a plurality of MTJ memory cells arranged in rows and columns. Memory array 10 includes a plurality of write word lines WWL and a plurality of read word lines RWL corresponding to rows of the MTJ memory cells, respectively, which may be merely referred to as "memory cell rows" hereinafter, although the structure of memory array 10 will be described later in greater detail. Also, bit lines BL and /BL are arranged corresponding to columns of the MTJ memory cells, which may be merely referred to as "memory cell columns" hereinafter.

MRAM device 1 further includes a row decoder 20, a column decoder 25, a word line driver 30 and read/write control circuits 50 and 60.

Row decoder 20 executes row selection in memory array 10 in accordance with a row address RA represented by address signal ADD. Column decoder 25 executes column selection in memory array 10 in accordance with a column address CA represented by address signal ADD. Based on results of row selection of row decoder 20, word line driver 30 selectively activates read word line RWL in the data read operation, and selectively activates write word line WWL in the data write operation. Row address RA and column address CA indicate the memory cell, which is selected as a target of data reading or writing, and may be referred to as a "selected memory cell" hereinafter.

Write word line WWL is coupled to a ground voltage GND in a region 40 spaced from word line driver 30 with memory array 10 therebetween.

Read/write control circuits 50 and 60 collectively represent circuit groups, which are arranged in regions neighboring to memory array 10 for supplying data write currents and data read currents to bit lines BL and /BL in a selected memory cell column (which may be referred to as a "selected column" hereinafter) corresponding to the selected memory cell.

Figure 2:
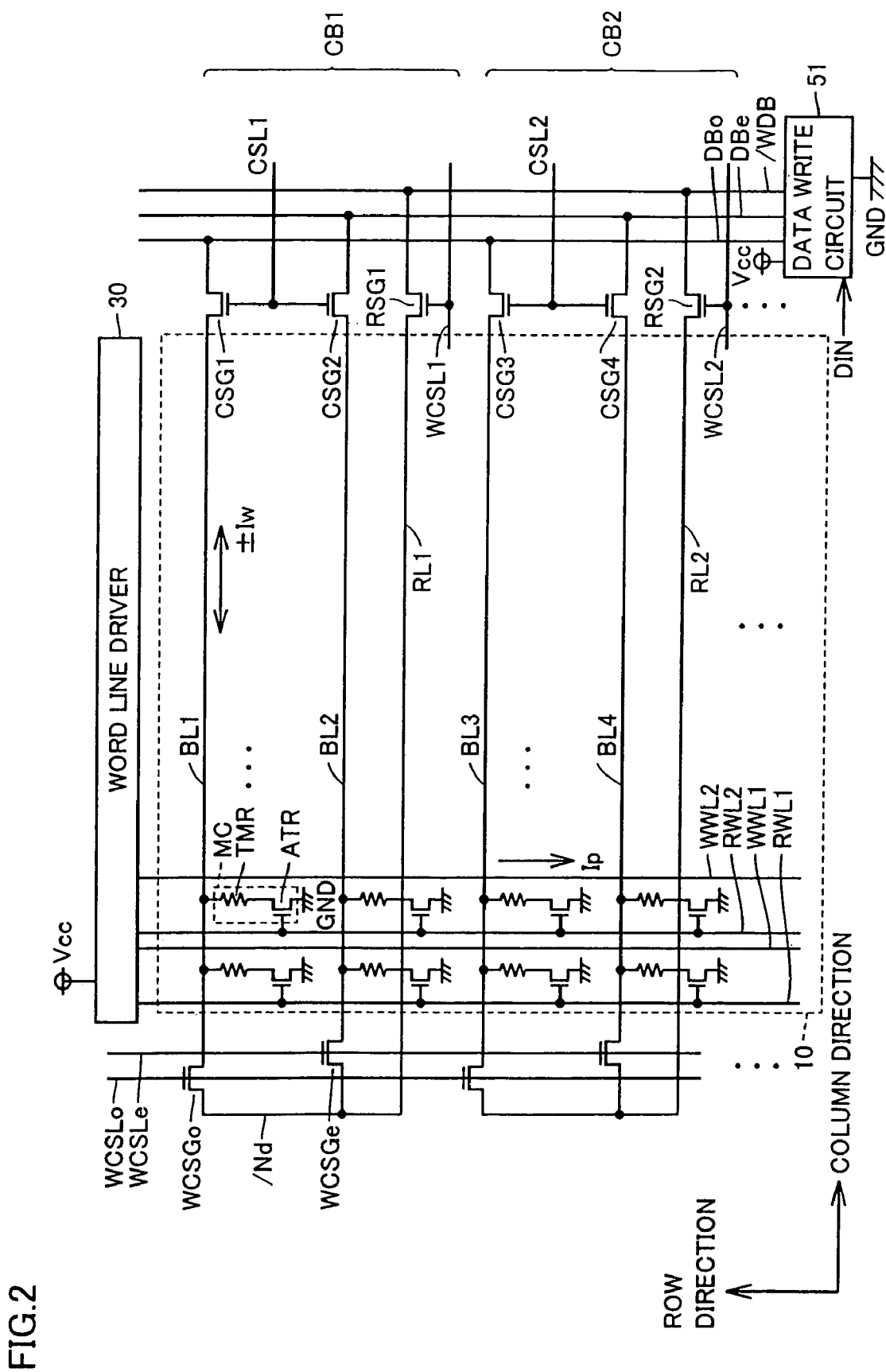
FIG. 2 is a circuit diagram showing a structure of a memory array according to the first embodiment.

FIG. 2 representatively shows structures of memory array 10 and circuits for writing data into memory array 10.

Referring to FIG. 2, memory array 10 includes MTJ memory cells MC arranged in rows and columns. Each MTJ memory cell MC includes a tunneling magneto-resistance element TMR serving as a magnetic memory portion, of which electric resistance is variable in accordance with the level of storage data, and also includes an access transistor ATR, which serves as an access element and is connected in series to tunneling magneto-resistance element TMR. As already described, a MOS transistor, which is a field-effect transistor formed on a semiconductor substrate, is typically used as access transistor ATR.

FIG. 2 representatively shows memory cells MC forming portions of memory cell columns in the first to fourth positions as well as bit lines BL1-BL4, read word lines RWL1 and RWL2, and write word lines WWL1 and WWL2 related to these memory cells MC.

In the following description, reference character sets "WWL", "RWL" and "BL" are used for collectively or generally indicating the write word line(s), read word line(s) and bit line(s), respectively. Reference character sets such as "WWL1", "RWL1" and "BL1", which include suffixes added to the above sets, are used for specifically indicating the write word line, read word line and bit line, respectively. A high voltage state (power supply voltage Vcc) and a low voltage state (ground voltage GND) of each of signals and signal lines may be referred to as "H-level" and "L-level" hereinafter, respectively.

In the data write operation, word line driver 30 activates and connects write word line WWL in the selected row to power supply voltage Vcc in accordance with results of row selection of row decoder 20. As already described with reference to FIG. 1, an end of each write word line WWL is coupled to ground voltage GND in region 40. Therefore, write word line WWL in the selected row carries a data write current Ip from word line driver 30 toward region 40.

In the unselected row, write word line WWL is maintained in an inactive state (L-level of ground voltage GND) so that the data write current does not flow. Each read word line RWL is maintained in an inactive state (L-level) in the data write operation.

The magnetic field caused by data write current Ip acts along the hard axis on tunneling magneto-resistance element TMR in the MTJ memory cell. The magnetic field caused by the data write current flowing through bit line BL in the selected column acts along the easy axis on the tunneling magneto-resistance element TMR in the MTJ memory cell.

Therefore, the direction of the data write current flowing through bit line BL in the selected column must be controlled in accordance with the level of write data DIN. In the following description, the data write currents flowing through the bit lines in the selected column for writing data "1" and "0" are represented by +Iw and −Iw, respectively. Further, data write currents +Iw and −Iw are collectively referred to as "data write currents ±Iw" hereinafter.

Description will now be given on a structure for supplying data write current ±Iw in the direction, which depends on the level of write data DIN, to the bit line in the selected column.

In the structure according to the first embodiment, a plurality of current return lines RL are arranged in the same direction as bit lines BL. Each current return line RL is provided for a plurality of memory cell columns.

Memory array 10 is divided into a plurality of column blocks CB each having the memory cell columns of K in number. FIG. 2 shows an example, in which each column block CB is formed of neighboring two memory cell columns, and thus K is equal to two. In this case, each column block CB is formed of one odd-numbered column and one even-numbered column. For example, the first and second memory cell columns form a column block CB1, and third and fourth memory cell columns form a column block CB2.

Current return line RL is arranged for each column block. Current return line RL is shared by the plurality of memory cell columns belonging to the same column block CB. For example, current return line RL1 corresponding to column block CB1 is shared by the first and second memory cell columns corresponding to bit lines BL1 and BL2, respectively.

Figure 3:
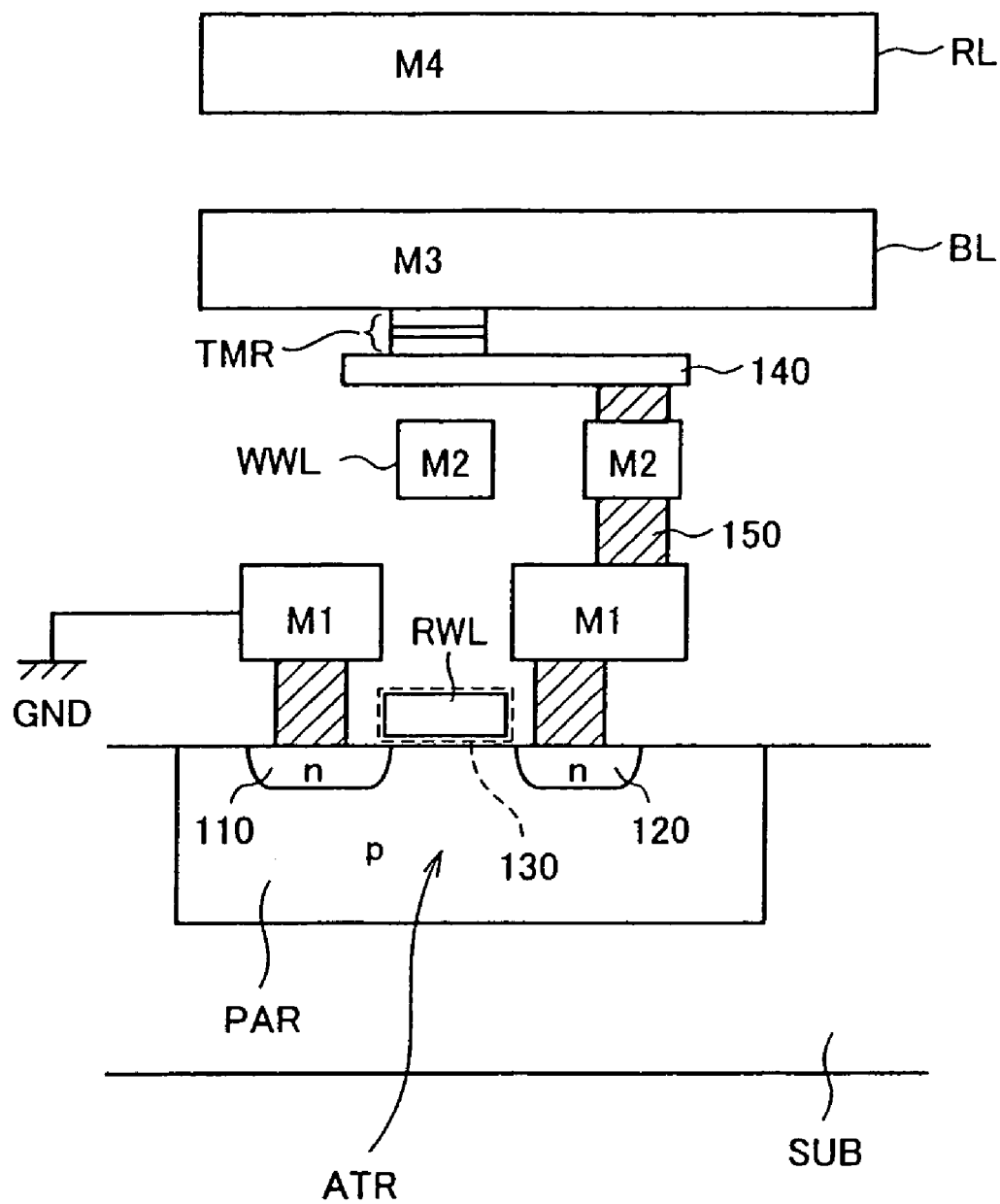
FIG. 3 shows an arrangement of a current return line shown in FIG. 2.

FIG. 3 shows an arrangement of current return line RL.

According to the structure of the first embodiment shown in FIG. 3, the MTJ memory cell is arranged on the semiconductor substrate. Access transistor ATR is formed at a p-type region PAR on a semiconductor main substrate SUB. Access transistor ATR has source/drain regions 110 and 120 formed of n-type regions and a gate 130. Source/drain region 110 is coupled to ground voltage GND via a metal interconnection formed at a first metal interconnection layer M1. Write word line WWL is made of a metal interconnection formed at a second metal interconnection layer M2. Bit line BL is formed at a third metal interconnection layer M3 located higher than tunneling magneto-resistance element TMR.

Tunneling magneto-resistance element TMR is arranged between second and third metal interconnection layers M2 and M3, which are provided with write word line WWL and bit line BL, respectively. Source/drain region 120 of access transistor ATR is electrically coupled to tunneling magneto-resistance element TMR via a metal film formed in a contact hole 150, first and second metal interconnection layers M1 and M2, and a barrier metal 140. Barrier metal 140 is a buffer provided for electrically coupling tunneling magneto-resistance element TMR and the metal interconnection.

In the MTJ memory cell, as already described, read word line RWL is formed of the interconnection independent of write word line WWL. Write word line WWL and bit line BL must carry data write currents for producing magnetic fields equal to or larger than predetermined magnitudes in the data write operation. Therefore, bit line BL and write word line WWL are made of metal interconnections, respectively.

Conversely, read word line RWL is provided for controlling a gate voltage of access transistor ATR, and therefore is not required to carry actively a current. For increasing a structure density, therefore, read word line RWL is not formed at an independent and dedicated metal interconnection layer, but is formed of a polycrystalline silicon layer or a polycide structure at the same interconnection layer as gate 130.

In the example of the structure shown in FIG. 3, current return line RL is made of a metal interconnection layer M4 independent of bit line BL. However, current return line RL may be made of a metal interconnection layer lower than bit line BL, or may be made of the same metal interconnection layer M3 as bit line BL.

Referring to FIG. 2 again, data buses of K in number, an inverted data bus /WDB and a data write circuit 51 are arranged in a region neighboring to memory array 10. If K is equal to two, two data buses DBo and DBe are arranged for the odd-numbered and even-numbered columns.

In the data write operation, one of data buses DBo and DBe as well as inverted data bus /WDB are used for supplying data write currents ±Iw. In the data read operation, the selected memory cell is coupled to corresponding one of data buses DBo and DBe.

Figure 4:
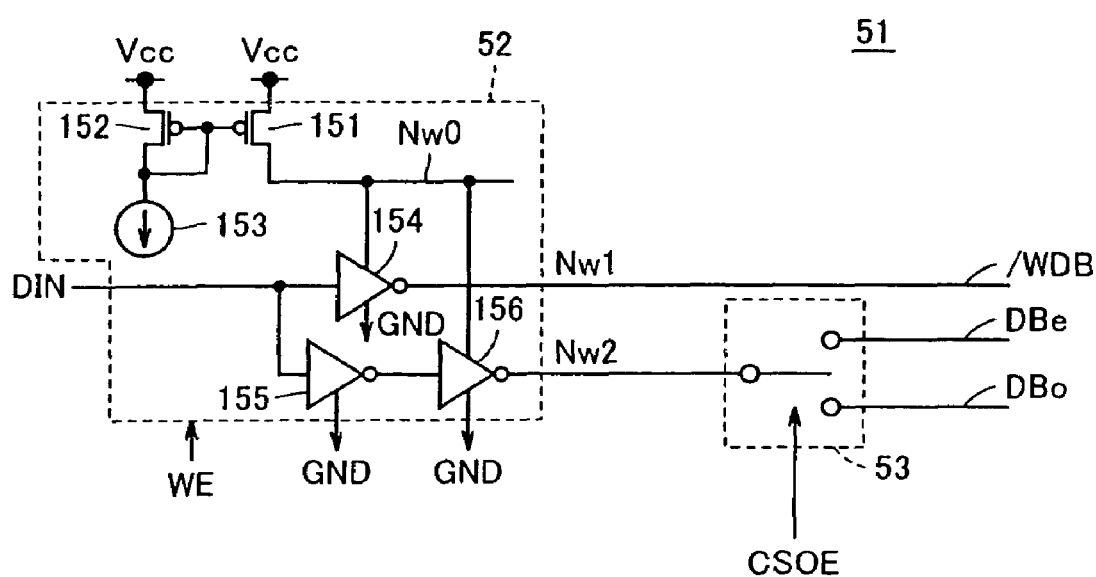
FIG. 4 is a circuit diagram showing a data write current shown in FIG. 2.

Referring to FIG. 4, data write circuit 51 has a data write current supply portion 52 and a switch circuit 53.

Data write current supply portion 52 includes a P-channel MOS transistor 151 for supplying a constant current to a node Nw0, a P-channel MOS transistor 152 forming a current mirror with transistor 151, and a current supply 153.

Data write current supply portion 52 further has inverters 154, 155 and 156 receiving operation currents from node Nw0 for operations. Inverter 154 inverts the voltage level of write data DIN, and transmits it to a node Nw1. Inverter 155 transmits the voltage level of write data DIN, and transmits it to an input node of inverter 156. Inverter 156 inverts the output of inverter 154, and transmits it to a node Nw2. Therefore, nodes Nw1 and Nw2 are set to power supply voltage Vcc and ground voltage GND or vice versa in accordance with the voltage level of write data DIN, respectively.

Node Nw1 is connected to inverted data bus /WDB. Switch circuit 53 selectively couples a node Nw2, which is set to a voltage at the same level as write data DIN, to one of data buses DBe and DBo in accordance with a select signal CSOE indicating which one of the odd-numbered and even-numbered columns is selected.

In the data write operation, therefore, data write circuit 51 sets data bus DBe or DBo corresponding to the results of column selection to the voltage at the same level as write data DIN, and sets inverted data bus /WDB to the voltage corresponding to the inverted level of write data DIN.

Description will now be given on column selection in memory array 10.

Referring to FIG. 2 again, a column select line CSL and a write column select line WCSL are arranged for each column block CB. Each column select line CSL is activated to attain H-level when the memory cell column in corresponding column block CB is selected in both the data read operation and the data write operation. Each write column select line WCSL is activated to attain H-level when the memory cell column in corresponding column block CB is selected in the data write operation.

In each column block CB, write column sub-select lines of K in number are arranged for selecting one from the K memory cell columns. If K is equal to two, write column sub-select lines WCSLo and WCSLe are arranged corresponding to the odd-numbered and even-numbered columns, respectively. Write column sub-select line WCSLo is activated to attain H-level when data writing is to be performed in the odd-numbered column. Write column sub-select line WCSLe is activated to attain H-level when data writing is to be performed in the even-numbered column.

Activation and deactivation of each column select line CSL, each write column select line WCSL and write column sub-select lines WCSLo and WCSLe are controlled by column decoder 25 in accordance with results of the column selection.

Description will now be given on structures for controlling connection of bit lines BL to the data bus and the inverted data bus.

A column select gate CSG is arranged corresponding to each memory cell column. Column select gate CSG in the odd-numbered column is electrically coupled between corresponding bit line BL and data bus BDo. Column select gate CSG in the even-numbered column is electrically coupled between corresponding bit line BL and data bus DBe. Each column select gate CSG is turned on in response to activation of corresponding column select line CSL.

For example, in column block CB1, column select gate CSG1 is arranged between bit line BL1 and data bus DBo, and column select gate CSG2 is arranged between bit line BL2 and data bus DBe. Each of column select gates CSG1 and CSG2 is turned on in response to activation of column select line CSL.

Current return line RL provided for each column block CB is connected in series to a select gate RSG and between node/Nd and inverted data bus/WDB. Select gate RSG is turned on in response to activation of corresponding write column select line WCSL.

For example, in column block CB1, current return line RL1 is connected in series to select gate RSG, which is turned on in response to activation of write column select line WCSL1, and between inverted data bus/WDB and node/Nd.

The K bit lines belonging to the same column block are connected to corresponding current return line RL through write column select gates of K in number, which are independent of each other. The K write column select gates are turned on in response to activation of the corresponding write column sub-select lines, respectively.

For example, in column block CB1, bit line BL1 is connected to node /Nd via write column select gate WCSGo, and bit line BL2 is connected to node/Nd via write column select gate WCSGe. Write column select gates WCSGo and WCSGe are turned on in response to activation of write column sub-select lines WCSLo and WCSLe, respectively.

If the memory cell column corresponding to bit line BL1 in the odd-numbered column is selected, data bus DBo and inverted data bus/WDB are set to H-level (power supply voltage Vcc) and L-level (ground voltage GND), or to L- and H-levels in accordance with the level of write data DIN, respectively. Since column select line CSL1, write column select line WCSL1 and write column sub-select line WCSLo become active, column select gate CSG1, select gate RSG1 and write column select gate WCSGo are turned on.

Accordingly, data write current ±Iw in the direction corresponding to the level of write data DIN can be passed through bit line BL1 by using bit line BL1 in the selected column and the corresponding current return line RL1, of which end is electrically connected to an end of bit line BL1 via node/Nd.

If the memory cell column corresponding to bit line BL2 in the even-numbered column is selected, data bus DBo and inverted data bus/WDB are set to H-level (power supply voltage Vcc) and L-level (ground voltage GND), or to L- and H-levels in accordance with the level of write data DIN, respectively. Since column select line CSL1, write column select line WCSL1 and write column sub-select line WCSLe become active, column select gate CSG2, select gate RSG1 and write column select gate WCSGe are turned on.

Accordingly, data write current ±Iw in the direction corresponding to the level of write data DIN can be passed through bit line BL2 by using bit line BL2 in the selected column and the corresponding current return line RL1, of which end is electrically connected to an end of bit line BL2 via node/Nd.

In the structure of the first embodiment, as described above, the path of data write current ±Iw flowing through bit line BL in the selected column is formed by using the current path, which includes current return line RL shared by the K memory cell columns and connected to inverted data bus /WDB.

Accordingly, data write current ±Iw corresponding to the write data can be passed through the bit line in the selected column by controlling the voltage levels of inverted data bus/WDB and K (e.g., K=2) data buses DBo and DBe shared by all the memory cell columns in memory array 10. Therefore, it is possible to simplify the circuit structure for controlling the direction of data write current ±Iw in accordance with the write data level.

In the data read operation, word line driver 30 activates read word line RWL in the selected row to set it to H-level. Column decoder 25 inactivates each write column select line WCSL and each of write column sub-select lines WCSLo and WCSLe to set them to L-level.

Thereby, bit line BL in each memory cell column is electrically disconnected from inverted data bus/WDB. Further, the selected memory cell is electrically coupled to data bus DBo or DBe. Therefore, the storage data can be read out from the selected memory cell by supplying a data read current from a data read circuit (not shown) to the data bus coupled to the selected memory cell and detecting a passing current or voltage changes of the data bus.

Although FIG. 2 representatively shows a structure corresponding to the first to fourth memory cell columns, the signal lines, select gates and others are arranged in a similar manner for the other memory cell columns.

Modification of First Embodiment

Figure 5:
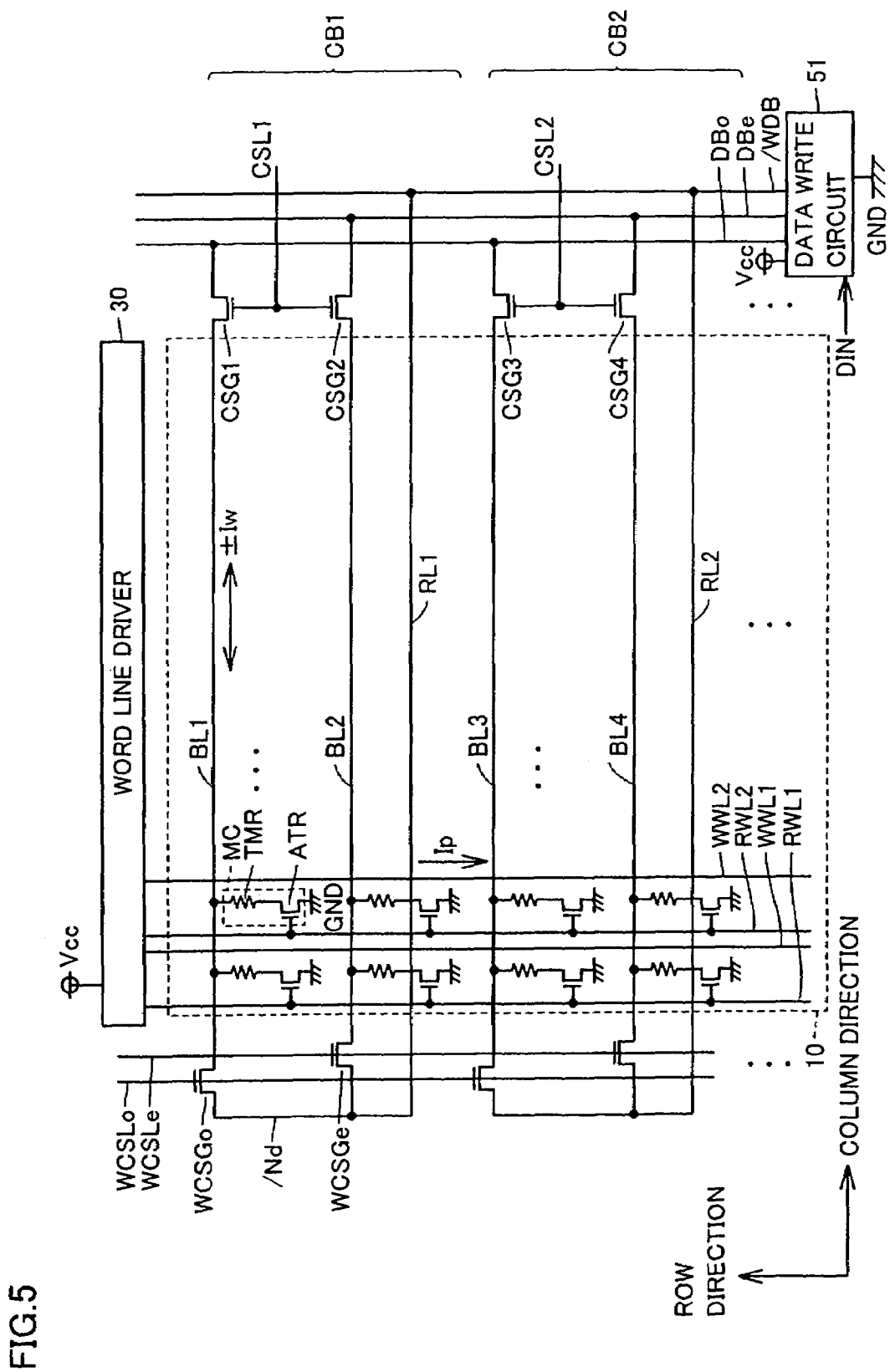
FIG. 5 is a circuit diagram showing a structure of a memory array according to a modification of the first embodiment.

Referring to FIG. 5, a structure according to a modification of the first embodiment differs from the structure according to the first embodiment shown in FIG. 2 in that select gate RSG is not arranged between each current return line RL and inverted data bus/WDB. According to the modification of the first embodiment, node/Nd is always coupled electrically to inverted data bus/WDB in each column block CB.

When the data writing is performed, however, each of column select gates CSG in the unselected column blocks is turned off in response to inactivation of corresponding column select line CSL. In the unselected column block, however, data write current ±Iw does not flow through bit line BL. When the data reading is performed, both write column select gates WCSGo and WCSGe are turned off in each column block so that each bit line BL is electrically disconnected from the corresponding current return line. Consequently, the structure according to the modification of the first embodiment can execute the data read operation similarly to the first embodiment.

Although select gate RSG corresponding to current return line is not employed, the structure can execute the data reading and writing similarly to the first embodiment. By eliminating select gate RSG, it is possible to simplify the structure of memory array 10.

In the first embodiment and its modification, column select line CSL and write column select line WCSL are arranged parallel to bit line BL and therefore in the column direction, and write column sub-select lines WCSLo and WCSLe are arranged in the row direction. However, these select lines can be arranged in any directions.

Second Embodiment

Figure 6:
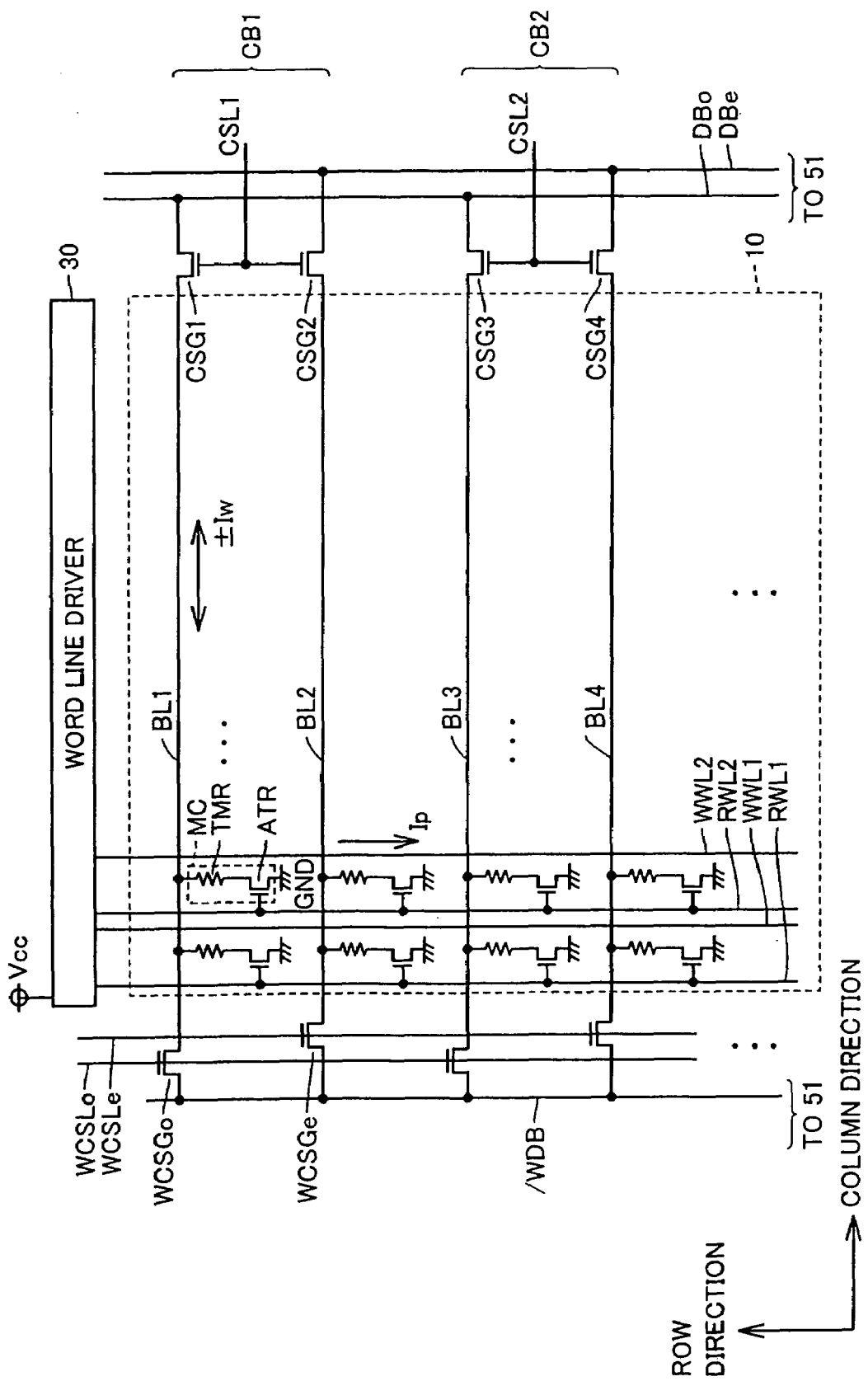
FIG. 6 is a circuit diagram showing a structure of a memory array according to a second embodiment.

Referring to FIG. 6, a structure according to a second embodiment differs from a structure according to the first embodiment in that current return line RL is not arranged in each column block, and a region including data buses DBo and DBe and a region including inverted data bus/WDB are arranged on the opposite sides of memory array 10, respectively.

Similarly to the first embodiment, each column block CB has K memory cell columns corresponding to different column addresses, respectively. FIG. 6 likewise shows a structure, in which K is equal to two.

Data buses DBo and DBe are arranged in one of two regions, which are spaced from each other in the column direction with memory array 10 therebetween, and extend in the row direction similarly to the first embodiment. Inverted data bus/WDB is arranged in the other region remote from data buses DBo and DBe with memory array 10 therebetween, and extends in the row direction.

In each column block CB, write column select gates WCSGo and WSCGe are electrically coupled between the inverted data bus/WDB and the corresponding bit lines, respectively.

Structures and operations of the other portions are substantially the same as those of the first embodiment and its modification, and therefore, description thereof is not repeated.

When the data writing is performed, K column select gates CSG electrically couples end portions on one side of the K bit lines to the K data buses in response to the activation of corresponding column select line CSL, respectively. Further, write column select gates WCSGo and WCSGe are turned on in response to the activation of corresponding write column sub-select lines WCSLo and WCSLe. Thereby, the other end portion of one bit line, which is selected from the K bit lines in accordance with results of the column selection, is electrically coupled to inverted data bus/WDB.

Owing to the above structure, it is possible to supply data write current ±Iw to the bit line in the selected column by a simple structure, which is similar to those of the first embodiment and the modification thereof, without arranging current return line RL.

Similarly to the first embodiment, only one column select line CSL is required for each column block and therefore for the K (more than one) memory cell columns. Therefore, it is possible to reduce remarkably the number of signal interconnections required for the column selection.

Third Embodiment

Figure 7:
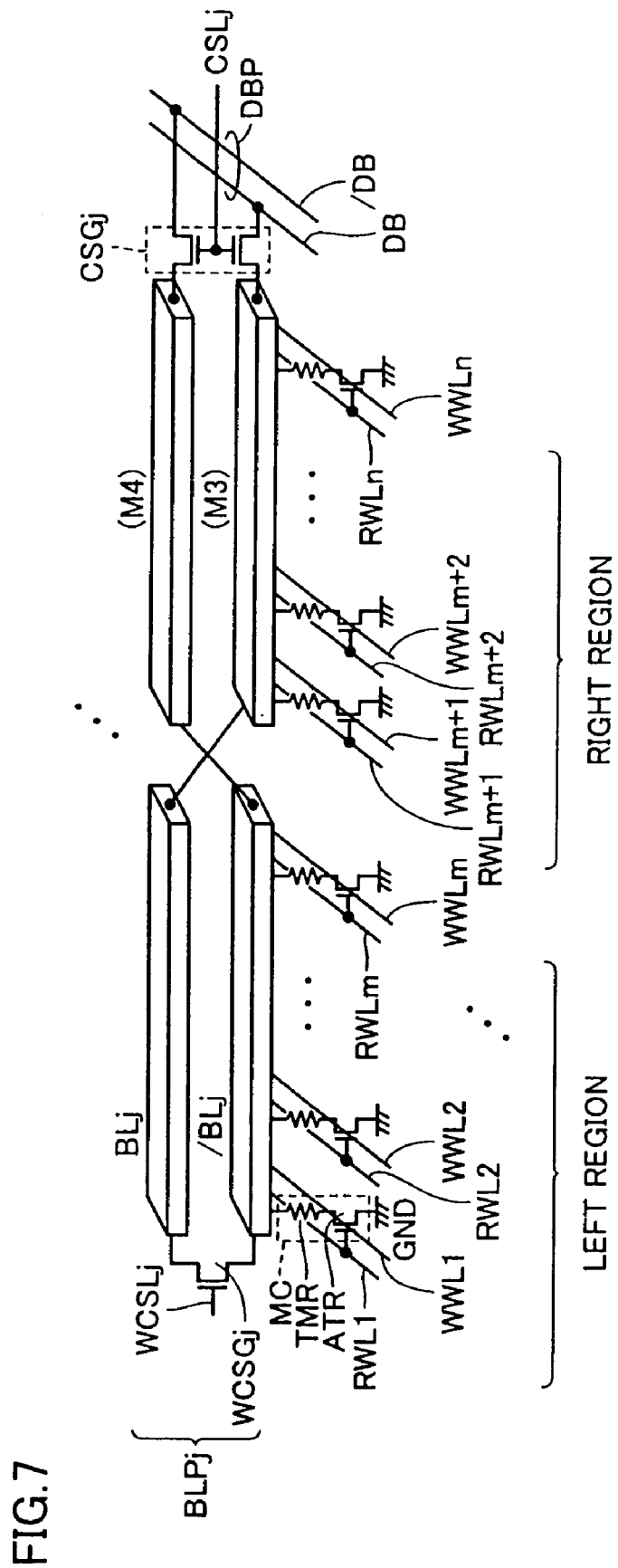
FIG. 7 conceptually shows an arrangement of bit lines according to a third embodiment.

Referring to FIG. 7, a structure according to a third embodiment is provided with bit line pairs corresponding to the memory cell columns, respectively. Each bit line pair is formed of two complementary bit lines. Although FIG. 7 representatively shows only a structure corresponding to the memory cell column in a jth (j: natural number) position, a similar structure is provided for each memory cell column.

Bit lines BLj and/BLj forming a bit line pair BLPj are made of metal interconnections, which are formed at two metal interconnection layers M3 and M4 located at a higher level than MTJ memory cells MC, respectively. Bit lines BLj and/BLj cross to interchange their vertical positions with each other in a predetermined position.

Memory array 10 includes n (n: integer larger than one) memory cell rows, and the memory cell rows of m (m: integer equal to n/2) in number are arranged in each of regions on the right and left sides of a predetermined region including the crossing between bit lines BL and/BL. In the left region including read word lines RWL1-RWLm and write word lines WWL1-WWLm, bit lines BL and/BL are made of interconnections arranged at metal interconnection layers M4 and M3, respectively. In the right region including read word lines RWLm+1-RWLn and write word lines WWLm+1-WWLn, bit lines BL and/BL are made of interconnections arranged at metal interconnection layers M3 and M4, respectively.

The interconnections corresponding to the bit lines BL formed at metal interconnection layers M3 and M4 are coupled together in a predetermined region. Likewise, the interconnections corresponding to the bit lines/BL formed at metal interconnection layers M3 and M4 are coupled together in a predetermined region. Bit lines BL and/BL are coupled to MTJ memory cells MC at their portions, which are spaced by a shorter distance from the MTJ memory cell, and therefore are formed at lower metal interconnection layer M3.

Write column select gate WCGj couples ends on one side of corresponding bit lines BL and/BL to each other in response to the activation of corresponding write column select line WCSLj.

Further, a data bus pair DBP formed of complementary data buses DB and/DB is provided. In the data write operation, the voltages on data buses DB and/DB are connected to nodes Nw2 and Nw1 of data write current supply portion 52 shown in FIG. 3, respectively. Therefore, data buses DB and/DB carry power supply voltage Vcc and ground voltage GND or vice versa in accordance with the level of write data DIN, respectively.

Column select gate CSGj has transistor switches for connecting ends on the other side of bit lines BLj and/BLj to data buses DB and/DB, respectively. These transistor switches are turned on in response to the activation of corresponding column select line CSLj.

Owing to the above structure, data write current ±Iw in the direction corresponding to write data DIN can flow through bit lines BL and/BL in the selected column as a reciprocating current, which is folded or turned by write column select gate WCSGj.

Similarly to the first embodiment, therefore, the data write current in the direction corresponding to the write data level can be supplied to the bit line in the selected column without requiring complication of peripheral circuits.

Since the currents in the opposite directions flow through vertically neighboring bit lines BL and/BL, respectively, magnetic noises, which are produced from bit lines BL and/BL in the selected column to act on the MTJ memory cells in the neighboring memory cell columns, weaken each other. Accordingly, an influence by the magnetic noises can be reduced, and thereby the erroneous writing of data can be prevented to improve the operation stability.

In the data read operation, write column select gate WCSG is turned off in each memory cell column so that ends on one side of bit lines BL and /BL are electrically disconnected from each other. In the selected column, column select gate CSG is turned on to connect the other ends of corresponding bit lines BL and/BL to data buses DB and/DB, respectively. In the data read operation, at least one of data buses DB and/DB is supplied with the data read current.

Particularly, each memory cell column may be provided with a dummy memory cell (not shown), which can be selectively connected to complementary bit lines BL and/BL, and has an intermediate electric resistance. Thus, the electric resistance of each dummy memory cell is set to a value intermediate between two kinds of electric resistances of the MTJ memory cells storing "1" and "0", respectively.

By arranging such dummy memory cells, data reading can be performed for each bit line pair based on the comparison between voltages on complementary bit lines BL and/BL with high resistances against noises.

According to the arrangement of the bit lines in the third embodiment, the memory cells connected to one of paired bit lines BL and /BL are equal in number to those connected to the other. Therefore, it is possible to prevent imbalance in R-C load between bit lines BL and/BL forming the same bit line pair BLP. Further, bit lines BL and/BL are twisted and crossed together so that interference noises between bit lines BL and/BL can be reduced in the data read operation, and data reading can be executed fast and precisely.

Modification of Third Embodiment

In a modification of the third embodiment, the bit lines are arranged in accordance with a combination of the structures of the second and third embodiments.

Figure 8:
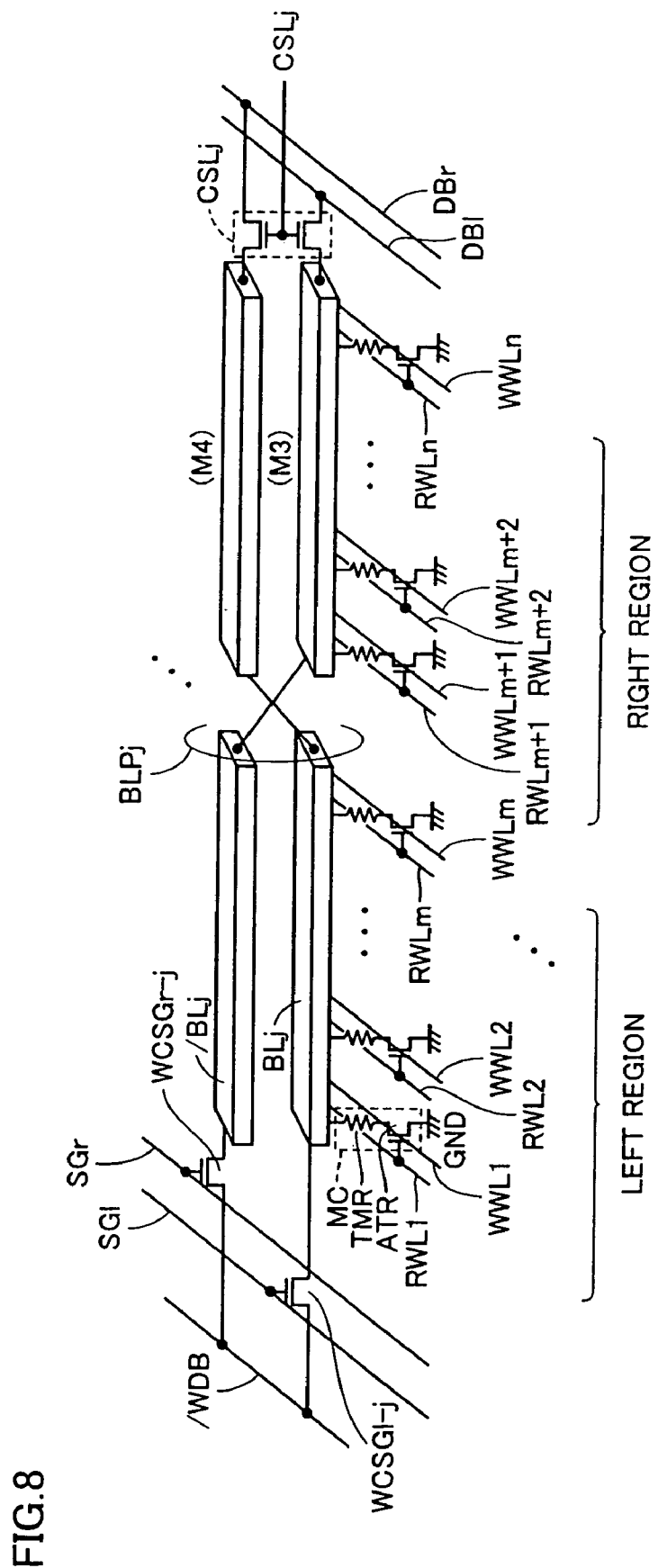
FIG. 8 conceptually shows an arrangement of bit lines according to a modification of the third embodiment.

Referring to FIG. 8, the structure of the modification of the third embodiment differs from the structure of the third embodiment in that data buses DB1 and DBr as well as inverted data bus/WDB are arranged instead of data bus pair DBP, and write column select switches WCSG1-j and WCSGr-j are arranged instead of write column select switch WCSGj.

Write column select gate WCSG1-j is arranged between inverted data bus/WDB and one end of bit line BLj, and is turned on in response to the activation of a control signal SG1. Control signal SG1 is activated to attain H-level when the selected memory cell is present in a region on the left of the predetermined region including the crossing between bit lines BL and /BL.

Write column select gate WCSGr-j is arranged between inverted data bus/WDB and one end of bit line/BLj, and is turned on in response to the activation of a control signal SGr. Control signal SGr is activated to attain H-level when the selected memory cell is present in a region on the right of the predetermined region including the crossing between bit lines BL and /BL.

In the data read operation, inverted data bus/WDB is electrically disconnected from bit lines BL and/BL in each memory cell column, and the data write current is supplied to at least one of data buses DB1 and DBr. Thereby, data reading can be performed similarly to the fourth embodiment.

Owing to the above structure, the data write current does not flow through the metal interconnection neighboring to the MTJ memory cell in a region, which does not include the selected memory cell, of the selected column. In the selected column, therefore, it is possible to suppress erroneous writing of data into the unselected memory cell.

Further, the data write current path on the bit line pair in the selected column can be shorter than that in the third embodiment, and therefore can have a smaller resistance. Therefore, the data operation speed can be increased, and the power consumption can be reduced.

In the third embodiment and the modification thereof, bit lines BL and/BL cross to interchange their relative vertical positions with each other only in one predetermined lengthwise region. However, bit lines BL and/BL may be configured to provide two or more crossings.

Fourth Embodiment

Figure 9:
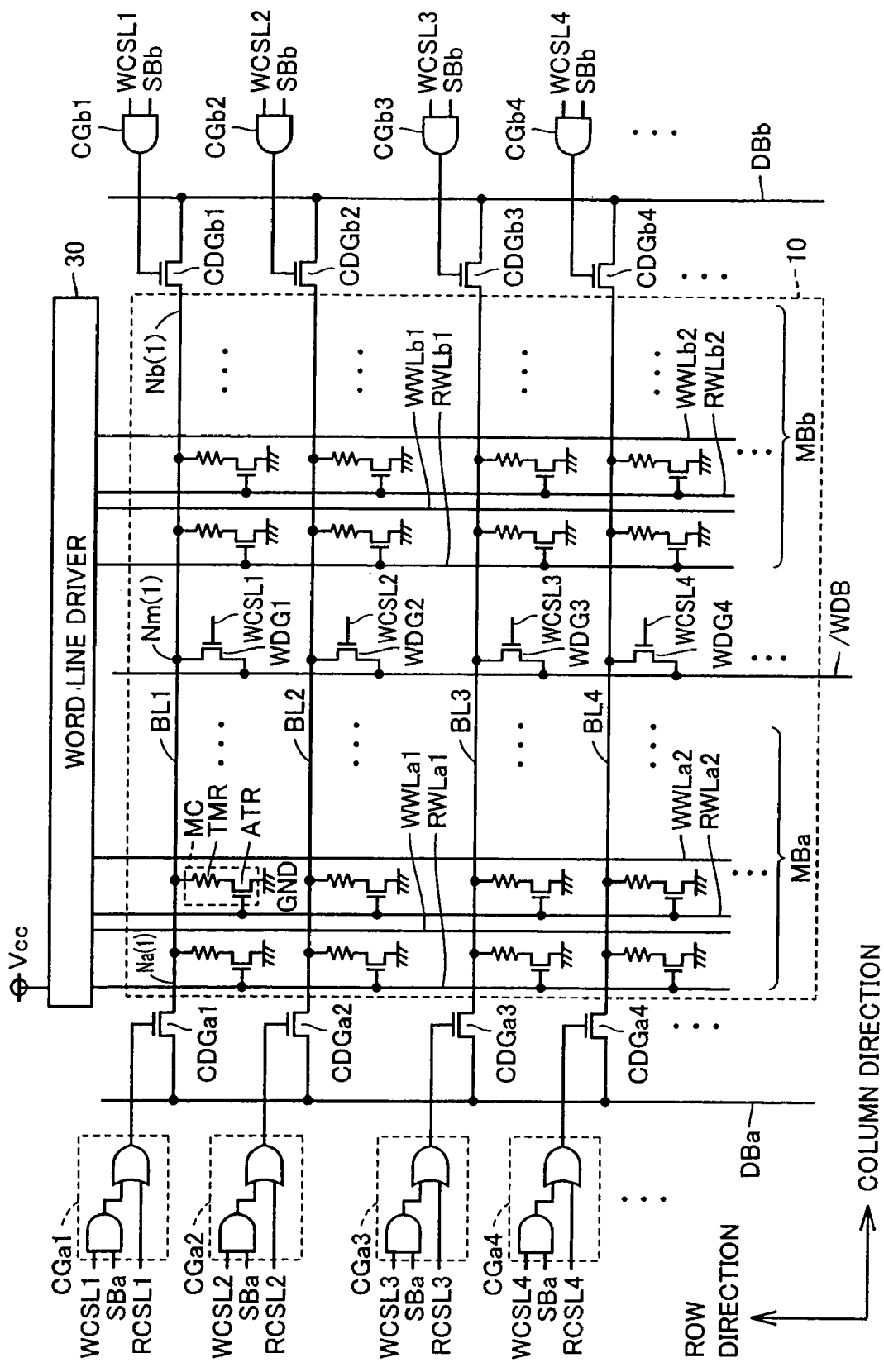
FIG. 9 is a circuit diagram showing a structure of a memory array according to a fourth embodiment.

In a structure of a fourth embodiment shown in FIG. 9, memory array 10 is divided into a plurality of memory blocks each extending in the row direction. In FIG. 9, memory array 10 is divided into two memory blocks MBa and MBb.

In memory block MBa, read word lines RWLa1, RWLa2, . . . as well as write word lines WWLa1, WWLa2, are arranged corresponding to the memory cell rows, respectively. In memory block MBb, read word lines RWLb1, RWLb2, . . . as well as write word lines WWLb1, WWLb2, . . . are likewise arranged corresponding to the memory cell rows, respectively. More specifically, read word lines RWL and write word lines WWL in memory block MBa are independent from those in memory block MBb.

In contrast to this, bit lines BL are arranged corresponding to the memory cell columns, respectively, and are provided in common to memory blocks MBa and MBb. However, the data bus in memory block MBa is independent from that in memory block MBb.

Data bus DBa for memory block MBa is arranged on one end side of bit lines BL (i.e., on the side of memory block MBa), and extends in the row direction through a region neighboring to memory array 10. Data bus DBb for memory block MBb is arranged on the other end side of bit lines BL (i.e., on the side of memory block MBb), and extends in the row direction through a region neighboring to memory array 10. Inverted data bus/WDB is shared by memory blocks MBa and MBb, and extends, for example, in the row direction through a boundary region between memory blocks MBa and MBb.

In each memory cell column, bit line BL is connected via drive switches on nodes corresponding to its opposite ends to data buses DBa and DBb, respectively, and is connected via an intermediate node to inverted data bus/WDB. For example, drive switches CDGa1 and CDGb1 are provided between nodes Na(1) and Nb(1), which correspond to one and the other ends of bit line BL1, and data buses DBa and DBb, respectively. A drive switch WDG1 is arranged between an intermediate node Nm(1) and inverted data bus/WDB.

Drive switches CDGa1 and CDGb1 are turned on/off in response to outputs of column control gates CGa1 and CGb1, respectively. Drive switch WDG1 is turned on in response to activation of corresponding write column select line WCSL1. Write column select lines WCSL are provided for the respective memory cell columns, respectively, and write column select line WCSL in the selected column is activated to attain H-level in the data write operation.

Column control gate CGa1 turns on corresponding drive switch CDGa1 when the corresponding first memory cell column is selected in the data write operation, and the selected memory cell belongs to memory block MBa. In the data read operation, column control gate CGa turns on corresponding drive switch gate CDGa1 when the corresponding first memory cell column is selected.

Column control gate CGa1 has an AND gate outputting results of logical AND between the voltage levels of corresponding write column select line WCSL1 and a block select signal SBa, and also has an OR gate outputting results of logical OR between the output of the above AND gate and the voltage level of a read column select line RCSL1. The output of the OR gate is sent to a gate of drive switch CDGa1 formed of an N-channel MOS transistor.

Read column select lines RCSL are provided for the memory cell columns, respectively, and read column select line RCSL in the selected column is activated to attain H-level in the data read operation. Block select signal SBa is activated to attain H-level if the selected memory cell belongs to memory block MBa. If the selected memory cell belongs to memory block MBa, block select signal SBb arranged similarly is activated to attain H-level.

Column control gate CGb1 turns on corresponding drive switch CDGb1 when the corresponding first memory cell column is selected in the data write operation, and the selected memory cell belongs to memory block MBb. In the data read operation, column control gate CGb1 turns off corresponding drive switch CSGb1 regardless of results of the column selection.

Column control gate CGb1 has an AND gate outputting results of logical AND between voltage levels of corresponding write column select line WCSL1 and block select signal SBb. The output of the AND gate is supplied to a gate of drive switch CDGb1 formed of an N-channel MOS transistor.

In the data write operation, data buses DBa and DBb as well as inverted data bus/WDB are set similarly to data buses DBo and DBe as well as inverted data bus/WDB in the first embodiment. More specifically, the structure similar to that of data write circuit 51 of the first embodiment is employed, and switch circuit 53 in this structure is controlled in accordance with block select signals SBa and SBb.

According to the above structure, for example, when the first memory cell column is selected in the data write operation, drive switch WDG1 is turned on, and either of drive switches CDGa1 and CDGb1 is turned on depending on memory block MBa or MBb, to which the selected memory cell belongs.

When the selected memory cell belongs to memory block MBa, drive switches CDGa1 and WDG1 located on the opposite sides of the selected memory cell are turned on to connect nodes Na(1) and Nm(1) on bit line BL to data bus DBa and inverted data bus/WDB, respectively. Thereby, nodes Na(1) and Nm(1) are set to power supply voltage Vcc and ground voltage GND, or vice versa depending on write data DIN, respectively.

Accordingly, data write current ±Iw depending on write data DIN can flow through a portion of bit line BL1 in the selected column, and particularly through a portion between node Nm(1) and node Na(1) corresponding to the memory block including the selected memory cell. In this operation, drive switch CDGb1 is turned off so that data write current does flow through a portion between node Nm(1) and node Nb(1), which does not correspond to the selected memory cell, of bit line BL1 in the selected column.

When the selected memory cell belongs to memory block MBb, drive switches CDGb1 and WDG1 located on the opposite sides of the selected memory cell are turned on, and drive switch CDGa1 is turned off. Therefore, bit line BL1 in the selected column can carry data write current ±Iw in the direction corresponding to write data DIN only between node Nm(1) and node Nb(1) corresponding to the memory block including the selected memory cell. On bit line BL1 in the selected column, data write current ±Iw does not flow between node Nm(1) and node Na(1) not corresponding to the selected memory cell.

FIG. 9 representatively shows the first to fourth memory cell columns as well as drive switches CDGa1-CDGa4, CDGb1-CDGb4 and WDG1-WDG4, column select gates CGa1-CGa4 and CGb1-CGb4, read column select lines RCSL1-RCSL4 and write column select lines WCSL1-WCSL4, which are arranged for the first to fourth memory cell columns. The drive switches, control gates, column select lines and others are similarly arranged in the other memory cell columns. In each memory cell column, the data write operation is performed similarly to the foregoing operation for the first memory cell column.

According to the structure of the fourth embodiment of the invention, as described above, the data write current in the direction corresponding to the write data level can be supplied to the bit line in the selected column without complicating peripheral circuits, as can be done in the first embodiment.

Further, the data write current is passed only through a partial section, which corresponds to the selected memory cell, of the bit line in the selected column so that the path of the data write current can be short, and thus a resistance of the path can be reduced. In recent years, an operation voltage has been lowered in view of demands for low power consumption and others. Even in a low voltage operation, the required data write current can be easily supplied owing to the low resistance of the data write current path. Also, the low resistance of the data write current path can contribute to the faster data write operation.

Further, the data write current does not flow through a partial section, which corresponds to the unselected memory block, of bit line BL even in the selected column. Therefore, it is also possible to suppress the erroneous writing of data into the memory cells in the unselected memory block.

According to the structure of the fourth embodiment, a plurality of intermediate nodes may be arranged on each bit line so that control can be performed by further subdividing the path into sections selectively carrying the data write current. In this case, the plurality of drive switches, which are provided corresponding to the node on one end, the plurality of intermediate nodes and the node on the other end, respectively, can be alternately related to the data bus and the inverted data bus.

First Modification of Fourth Embodiment

Figure 10:
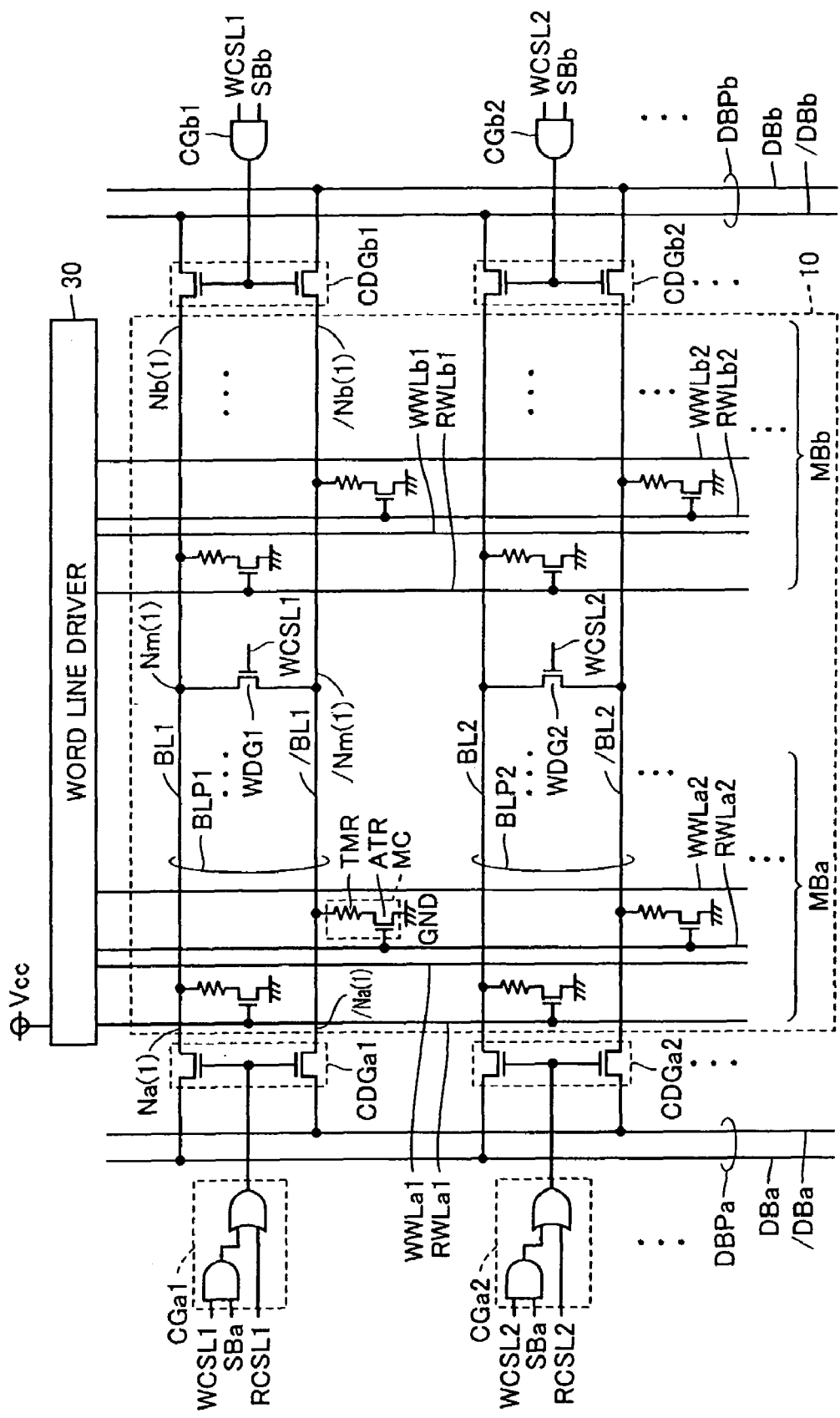
FIG. 10 is a circuit diagram showing a structure of a memory array according to a first modification of the fourth embodiment.

According to a first modification of a fourth embodiment shown in FIG. 10, memory array 10 employs a folded bit line structure. Memory array 10 is divided into a plurality of memory blocks each extending in the row direction, similarly to the fourth embodiment. In FIG. 10, memory array 10 is divided into two memory blocks MBa and MBb. Read word line RWL and write word line WWL are arranged for each memory cell row in each of memory blocks MBa and MBb.

According to the folded bit line structure, bit line pair BLP formed of complementary bit lines BL and/BL is arranged corresponding to each memory cell column. Complementary bit lines BL and/BL are arranged commonly to memory blocks MBa and MBb. For example, bit lines BL1 and/BL1 form bit line pair BLP1 for the memory cell column in the first position.

MTJ memory cells MC in alternate rows are connected to the same kind of bit lines BL or bit lines/BL. For example, the TMJ memory cells in the first memory cell column are coupled such that the MTJ memory cell in the first row is coupled to bit line BL1, and the MTJ memory cell in the second row is coupled to bit line/BL1. Likewise, the other MTJ memory cells in the odd-numbered rows are connected to bit lines BL1, and the other MTJ memory cells in the even-numbered rows are connected to bit lines/BL1.

Data bus pairs DBPa and DBPb corresponding to memory blocks MBa and MBb are arranged on the regions neighboring to memory array 10, respectively. Data bus pair DBPa extends in the row direction through the region near memory block MBa, and includes complementary data buses DBa and/DBa. Likewise, data bus pair DBPb extends in the row direction through a region near memory block MBb, and includes complementary data buses DBb and/DBb.

According to the structure of the modification of the fourth embodiment, the drive switches, control gates, column select line and others in each memory cell column are the same as those in the other memory cell columns. Therefore, description will now be given by way of example on the first memory cell column.

Drive switch CDGa1 has transistor switches connected between nodes Na(1) and/Na(1), which correspond to ends on one side of bit lines BL1 and/BL1, respectively, and data buses DBa and/DBa, respectively. These transistor switches are turned on/off in response to the output of column control gate CGa1 having a structure similar to that in FIG. 9.

Drive switch CDGb1 has transistor switches connected between nodes Nb(1) and/Nb(1), which correspond to the other ends of bit lines BL1 and/BL1, respectively, and data buses DBb and/DBb, respectively. These transistor switches are turned on/off in response to the output of column control gate CGb1 having a structure similar to that in FIG. 9.

Drive switch WDG1 is connected between intermediate nodes Nm(1) and/Nm(1) of bit lines BL and/BL located in a boundary between memory blocks MBa and MBb. Similarly to the structure shown in FIG. 9, drive switch WDG1 is turned on/off in response to corresponding write column select line WCSL1.

Data buses DBa and/DBa forming data bus pair DBPa are connected to nodes Nw2 and Nw1 of data write current supply portion 52 shown in FIG. 3 when memory block MBa includes the selected memory cell. Therefore, data buses DBa and/DBa are set to power supply voltage Vcc and ground voltage GND, or vice versa in accordance with the level of write data DIN, respectively.

Likewise, data buses DBb and/DBb forming data bus pair DBPb are set to power supply voltage Vcc and ground voltage GND, or vice versa in accordance with the level of write data DIN, respectively, when memory block MBb includes the selected memory cell.

Accordingly, when the first memory cell column is selected, and the selected memory cell belongs to the memory block MBa, drive switches CDGa1 and WDG1 on the opposite sides of the selected memory cell are turned on, and data write current ±Iw corresponding to write data DIN flows through a path of (Na(1)—Nm(1)—/Nm(1)—/Na(1)) formed on bit line pair BLP in the selected column. Other drive switch CDGb1 is turned off. Therefore, even on bit line pair BLP1 in the selected column, the data write current does not flow through sections not corresponding to the selected memory cell, and thus through a section between nodes Nb(1) and Nm(1) and a section between nodes/Nb(1) and/Nm(1).

Conversely, when the selected memory cell belongs to memory block MBb, drive switches CDGb1 and WDG1 located on the opposite sides of the selected memory cell are turned on, and drive switch CDGa1 is turned off. On bit line pair BLP1 in the selected column, therefore, data write current ±Iw in the direction corresponding to write data DIN can flow only through a path corresponding to the memory block including the selected memory cell. Even on the bit line pair BLP1 in the selected column, the data write current does not flow through a section not corresponding to the selected memory cell.

The above structure of the modification of the fourth embodiment, which employs the folded bit line structure in memory array 10 can execute the data writing similarly to the fourth embodiment.

Each memory cell column may employ dummy memory cells (not shown), which can be selectively connected to complementary bit lines BL and/BL, respectively, and each have an intermediate electric resistance. More specifically, the electric resistance of each dummy memory cell is set to a value intermediate between two kinds of electric resistances of the MTJ memory cells storing "1" and "0", respectively.

By arranging such dummy memory cells, data reading can be performed for each bit line pair based on the comparison between voltages on complementary bit lines BL and/BL with high resistances against noises.

Second Modification of Fourth Embodiment

Figure 11:
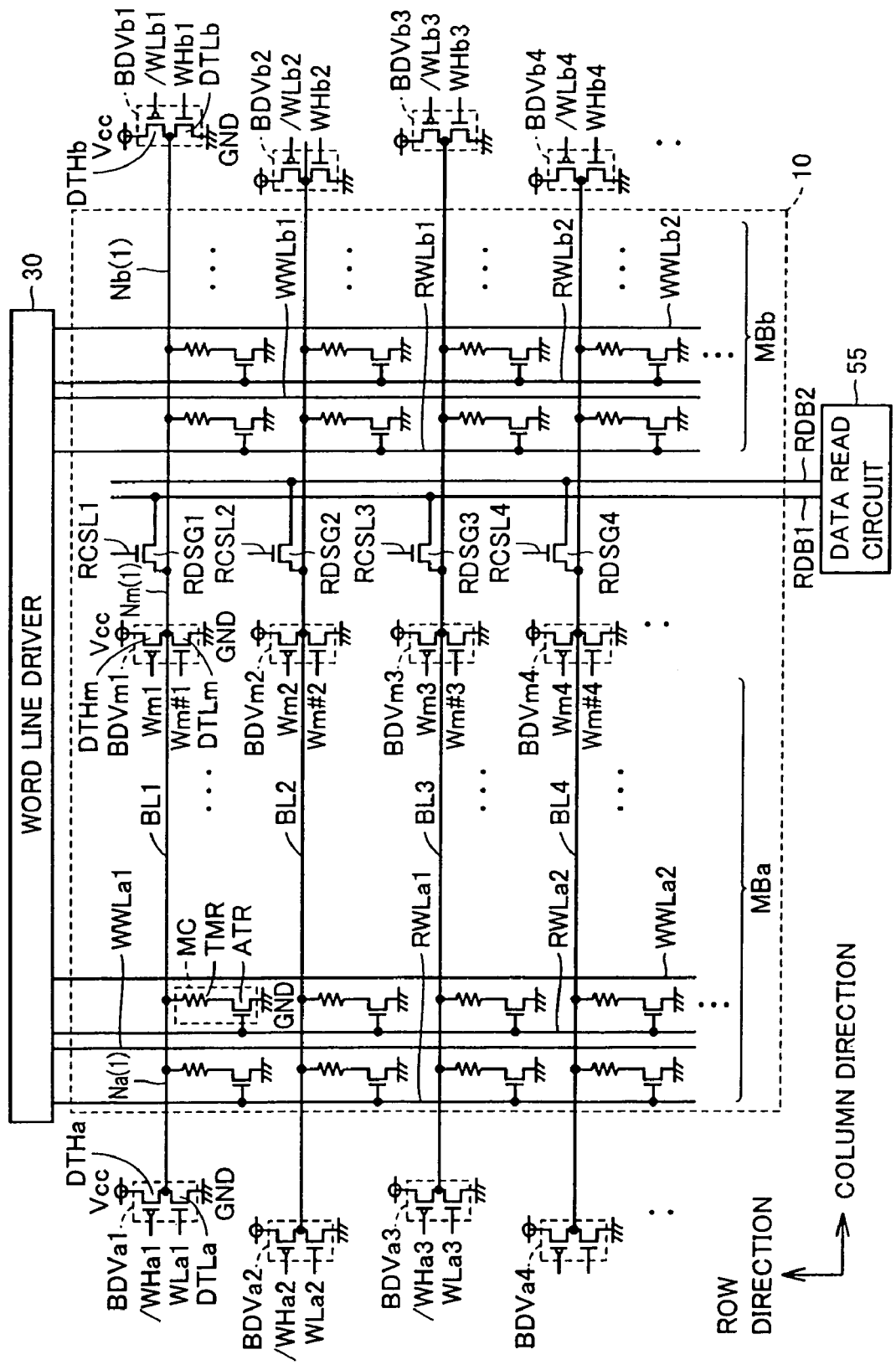
FIG. 11 is a circuit diagram showing a structure of a memory array according to a second modification of the fourth embodiment.

Referring to FIG. 11, a structure according to a second modification of the fourth embodiment differs from the structure according to the fourth embodiment shown in FIG. 9 in that bit line drivers BDVa, BDVb and BDVm are arranged corresponding to each bit line BL instead of drive switches CDGa, CDGb and WDG.

For example, bit line drivers BDVa1 and BDVb1 are arranged corresponding to nodes Na(1) and Nb(1) on one and the other end sides of bit line BL1, respectively, and bit line driver BDVm1 is arranged corresponding to intermediate node Nm(1).

Bit line driver BDVa1 has driver transistors DTHa and DTLa connected between power supply voltage Vcc and node Na(1) and between ground voltage GND and node Na(1), respectively. Driver transistors DTHa and DTLa are turned on/off in response to write control signals /WHa1 and WLa1, respectively. Likewise, bit line driver BDVb1 has driver transistors DTHb and DTLb connected between power supply voltage Vcc and node Nb(1) and between ground voltage GWD and node Nb(1), respectively. Driver transistors DTHb and DTLb are turned on/off in response to write control signals/WHb1 and WLb1, respectively. Bit line driver BDVm1 has driver transistors DTHm and DTLm connected between power supply voltage Vcc and intermediate node Nm(1) and between ground voltage GND and intermediate node Nm(1), respectively. Driver transistors DTHm and DTLm are turned on/off in response to write control signals Wm1 and Wm#1, respectively.

In each memory cell column, bit line drivers BDVa, BDVb and BDVm having similar structures are arranged. However, the write control signals controlling the driver transistor group in each memory cell column are set independently of the write control signals for the other memory cell columns. In this modification, a data write circuit (not shown) produces write control signals in accordance with results of the memory block selection and results of the column selection.

In the selected column, if the selected memory cell belongs to memory cell block MBa, bit line drivers BDVa and BDVm drive corresponding nodes Na and Nm to one and the other of power supply voltage Vcc and ground voltage GND corresponding to the write data, respectively. However, bit line driver BDVb drives node Nb to neither power supply voltage Vcc nor ground voltage GND.

In contrast to this, if the selected memory cell belongs to memory cell block MBb, bit line drivers BDVb and BDVm in the selected column drive corresponding nodes Nb and Nm to one and the other of power supply voltage Vcc and ground voltage GND in accordance with the write data, respectively, and bit line driver BDVa drives node Na to neither power supply voltage Vcc nor ground voltage GND.

As a result, the data write current in the direction corresponding to the write data can be passed only through a portion (between nodes Na and Nm or between nodes Nb and Nm), which corresponds to the selected memory cell, of the bit line in the selected column, similarly to the structure shown in FIG. 9. Therefore, the resistance of the path of the data write current can be lowered so that the required data write current can be supplied easily even in the low voltage operation, and the data write operation can be performed faster. Further, it is possible to suppress erroneous writing of data into the memory cell of the unselected memory cell in the selected column.

In the data write operation, bit line drivers BDVa, BDVb and BDVm in each unselected column drive corresponding nodes Na, Nb and Nm to ground voltage GND, and thereby prevent flowing of an unintended current. In the states other than the data writing, bit line drivers BDVa, BDVb and BDVm drive corresponding nodes Na, Nb and Nm to neither power supply voltage Vcc nor ground voltage GND, respectively.

Further, read data buses RDB1 and RDB2 are arranged corresponding to intermediate node Nm, and are located in a boundary portion between memory blocks MBa and MBb. Read data buses RDB1 and RDB2 extend in the row direction crossing bit line BL.

Corresponding to each memory cell column, read select gates RDSG1-RDSG4, . . . are arranged for selectively connecting read data buses RDB1 and RDB2 to bit lines BL. Read select gates RDSG1-RDSG4, . . . are turned on in response to activation of read column select lines RCSL1-RCSL4, respectively. Each of the read select gates in the odd-numbered columns is connected between corresponding intermediate node Nm and read data bus RDB1. Each of the read select gates in the even-numbered columns is connected between corresponding intermediate node Nm and read data bus RDB2.

In the data read operation, the bit line in the selected column is connected to ground voltage GND via the selected memory cell in response to the activation of read word line RWL in the selected row. In this state, a data read circuit 55 passes the read current through read data buses RDB1 and RDB2, and the data is read from the selected memory cell by detecting the currents/voltages on the read data buses RDB1 and RDB2.

Since read data buses RDB1 and RDB2 are configured to be connected to intermediate node Nm on the bit line in the selected column, the bit line length in the read current path can be reduced, and the electric resistance of the read current path can be reduced. Therefore, the data read speed and the data read margin can be improved.

In the folded bit line structure shown in FIG. 10, bit line drivers BDVa, BDVb and BDVm may be arranged instead of drive switches CDGa, CDGb and WDG. In this structure, the read data bus and read select gate may be arranged corresponding to intermediate node Nm similarly to those shown in FIG. 11.

Fifth Embodiment

Figure 12:
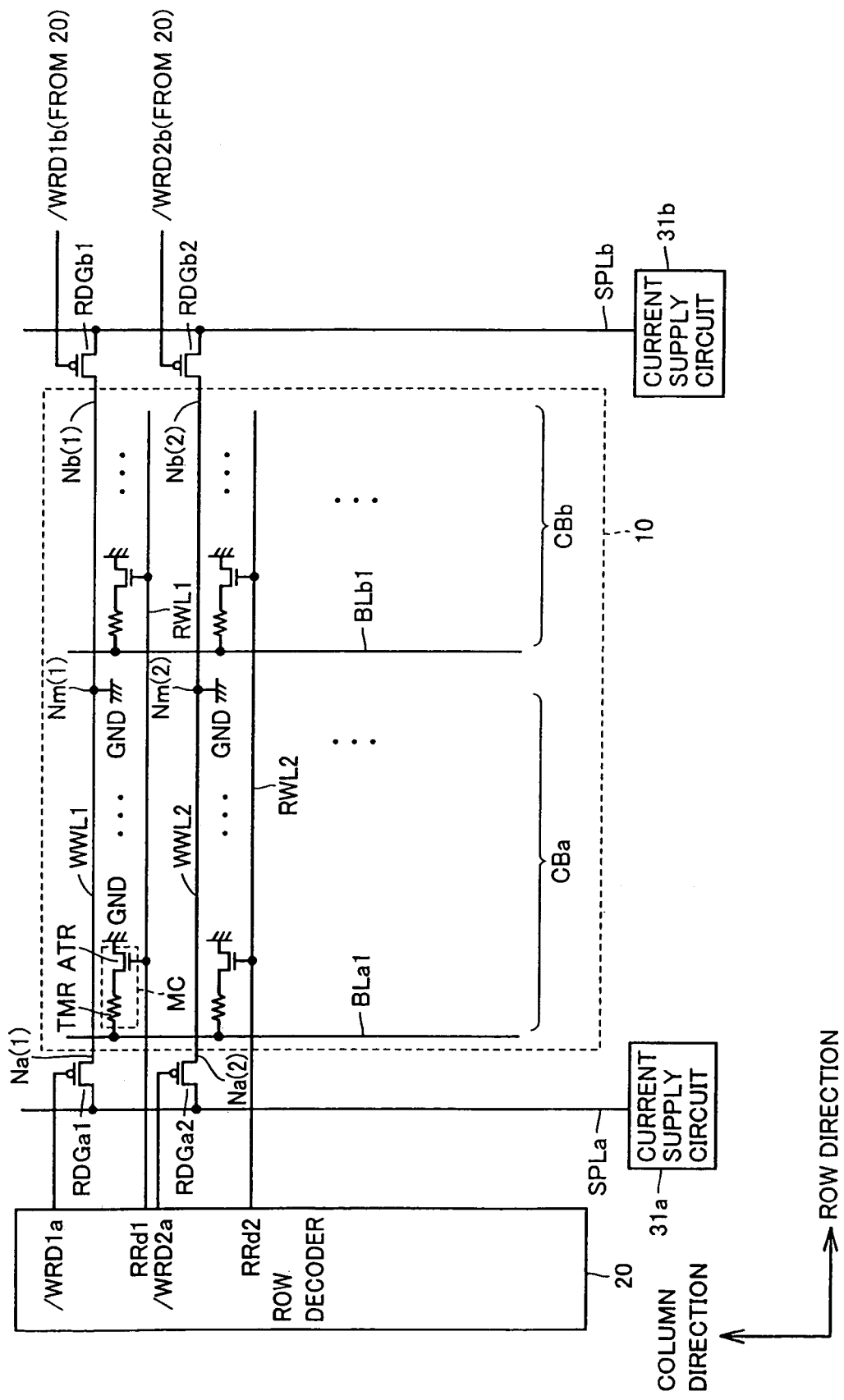
FIG. 12 is a circuit diagram showing supply of data write currents to write word lines according to a fifth embodiment.

According to a structure of a fifth embodiment shown in FIG. 12, memory array 10 is divided into a plurality of column blocks each extending in the column direction. In FIG. 12, memory array 10 is divided into two column blocks CBa and CBb.

In column block CBa, bit lines BLa1, . . . are arranged corresponding to the memory cell columns, respectively. Likewise, bit lines BLb1 . . . are arranged corresponding to the memory cell columns in column block CBb, respectively. Thus, bit lines BL in column block CBa are independent from those in column block CBb.

In contrast to the above, read word lines RWL and write word lines WWL are arranged corresponding to the memory cell rows, respectively, and are in common to the column blocks CBa and CBb.

Each write word line WWL is connected at its intermediate node Nm to ground voltage GND. For example, write word line WWL1 corresponding to the first memory cell row is connected to ground voltage GND via intermediate node Nm(1) corresponding to a boundary between column blocks CBa and CBb. Write word line WWL2 corresponding to the second memory cell row is connected to ground voltage GND via intermediate node Nm(2).

FIG. 12 representatively shows a structure employed in word line driver 30 for driving write word line WWL.

Word line driver 30 has a current supply line SPL and a current supply circuit 31 provided for each column block. FIG. 11 shows current supply lines SPLa and SPLb as well as current supply circuits 31a and 31b corresponding to column blocks CBa and CBb, respectively.

Figure 13:
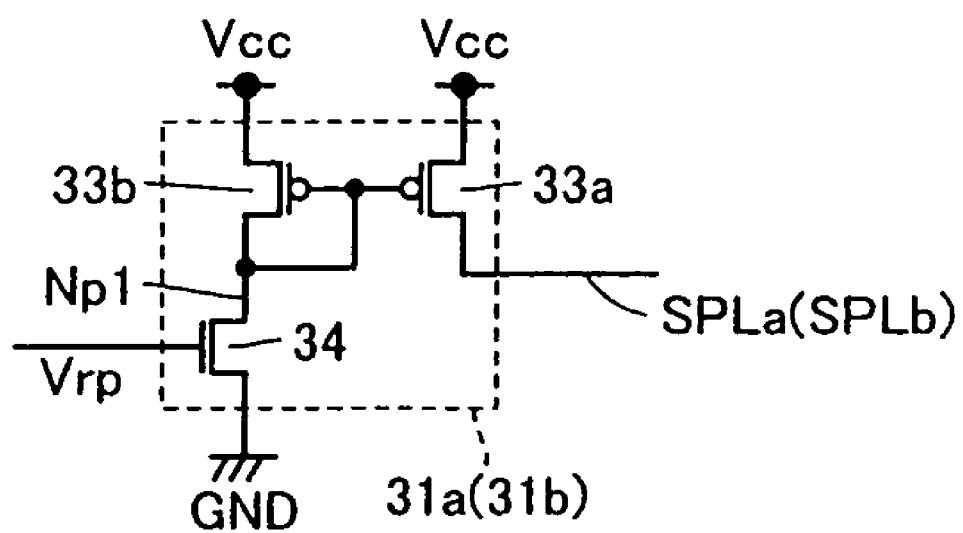
FIG. 13 is a circuit diagram showing a structure of a current supply circuit shown in FIG. 12.

Referring to FIG. 13, current supply circuit 31a includes a P-channel MOS transistor 33a electrically coupled between power supply voltage Vcc and current supply line SPLa, a P-channel MOS transistor 33b electrically coupled between power supply voltage Vcc and a node Np1, and an N-channel MOS transistor 34 electrically coupled between node Np1 and ground voltage GND.

Each of gates of transistors 33a and 33b is connected to node Np1, and a gate of transistor 34 receives a control voltage Vrp. Thereby, a current mirror formed of transistors 33a and 33b supplies a constant current corresponding to control voltage Vrp to current supply line SPLa carrying power supply voltage Vcc. Current supply circuit 31b has substantially the same structure as current supply circuit 31a.

Referring to FIG. 12 again, word line driver 30 further includes a drive switch RDGa arranged between node Na on one end portion of write word line WWL and current supply interconnection SPLa, and a drive switch RDGb arranged between node Nb on the other end of write word line WWL and current supply interconnection SPLb. FIG. 11 representatively shows drive switches RDGa1, RDGa2, RDGb1 and RDGb2 corresponding to nodes Na(1), Na(2), Nb(1) and Nb(2) in the first and second memory cell rows, respectively.

Drive switch RDGa is turned on when the corresponding memory cell row is selected, and the selected memory cell belongs to column block CBa. Likewise, drive switch RDGb is turned on when corresponding memory cell row is selected, and the selected memory cell belongs to column block CBb. For example, drive switch RDGa1 receives on its gate a control signal /WRD1a, which is activated to attain L-level when the first memory cell row is selected in the data write operation, and the selected memory cell belongs to column block CBa. Likewise, drive switch RDGb1 receives on its gate a control signal/WRD1b, which is activated to attain L-level when the first memory cell row is selected in the data write operation, and the selected memory cell belongs to column block CBb. Control signals /WRD1a, /WRD1b, ... are produced by row decoder 20 in accordance with results of row selection.

Row decoder 20 produces control signals RRd for the respective memory cell rows. Control signal RRd is activated to attain H-level when the corresponding memory cell row is selected in the data read operation. The voltage on each read word line RWL is controlled in accordance with corresponding control signal RRd. For example, read word line RWL1 is activated to attain H-level in response to the activation of control signal RRd1.

Owing to the above structure, word line driver 30 selectively turns on drive switches RDGa and RDGb in the selected row according to the positional relationship between the selected memory cell and intermediate node Nm. Consequently, data write current Ip in the predetermined direction can flow-through the write word line in the selected memory cell, and more specifically, through a section between nodes Na and Nm or a section between nodes Nb and Nm corresponding to the selected memory cell.

According to the structure of the fifth embodiment, as already described, only a partial section, which corresponds to the selected memory cell, of the write word line in the selected row can carry the data write current. In the selected row, therefore, it is possible to suppress erroneous writing of data into the memory cell in the unselected column block. Further, the data write current path can be short, and therefore the resistance thereof can be low so that the data write operation speed can be increased, and the power consumption can be reduced.

First Modification of Fifth Embodiment

Figure 14:
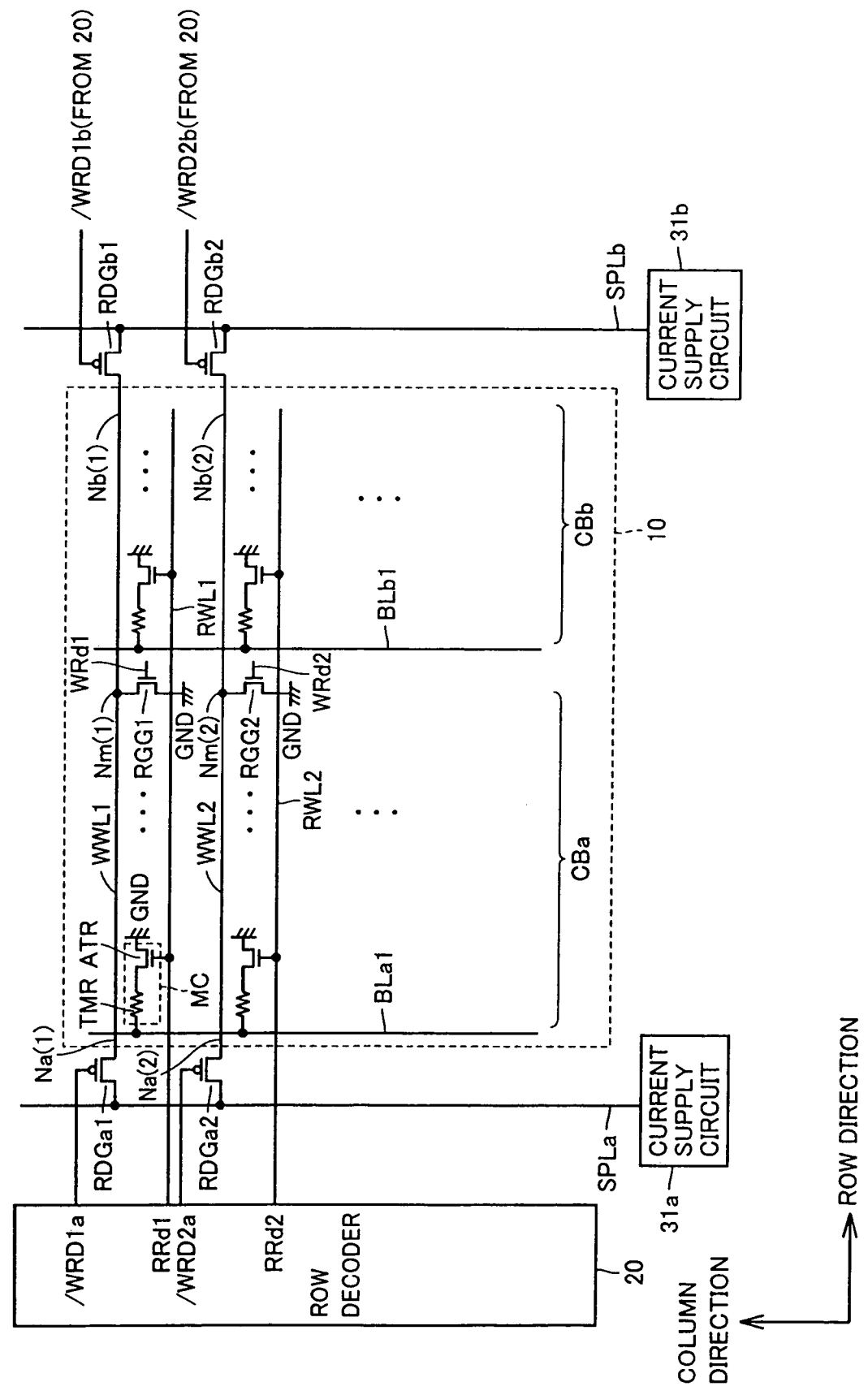
FIG. 14 is a circuit diagram showing a structure of a memory array according to a first modification of the fifth embodiment.

Referring to FIG. 14, a structure of a first modification of the fifth embodiment differs from the structure of the fifth embodiment shown in FIG. 12 in that the word line driver further includes drive switches RGG provided corresponding to write word lines WWL, respectively. Drive switch RGG is connected between intermediate node Nm and ground voltage GND. For example, drive switch RGG1 is provided for write word line WWL1, and is electrically coupled between intermediate node Nm(1) and ground voltage GND.

Drive switch RGG is formed of, e.g., an N-channel MOS transistor, and has a gate receiving a control signal WRd, which is activated to attain H-level when the corresponding memory cell row is selected. For example, the gate of drive switch RDG1 receives control signal WRd1, which is activated to attain H-level when the first memory cell row is selected. In the selected row, therefore, drive switch RGG in the on state connects corresponding intermediate node Nm to ground voltage GND.

Other portions of word line drive 30 have substantially the same structures as those in the fifth embodiment, and therefore description thereof is not repeated.

Owing to the structures described above, it is possible to lower the possibility that an unintended data write current flows through unselected write word line WWL, so that erroneous writing of data can be further suppressed as compared with the structure of the fifth embodiment.

Second Modification of Fifth Embodiment

A second modification of the fifth embodiment will now be described in connection with an efficient arrangement of drive switches forming word line driver 30.

Figure 15:
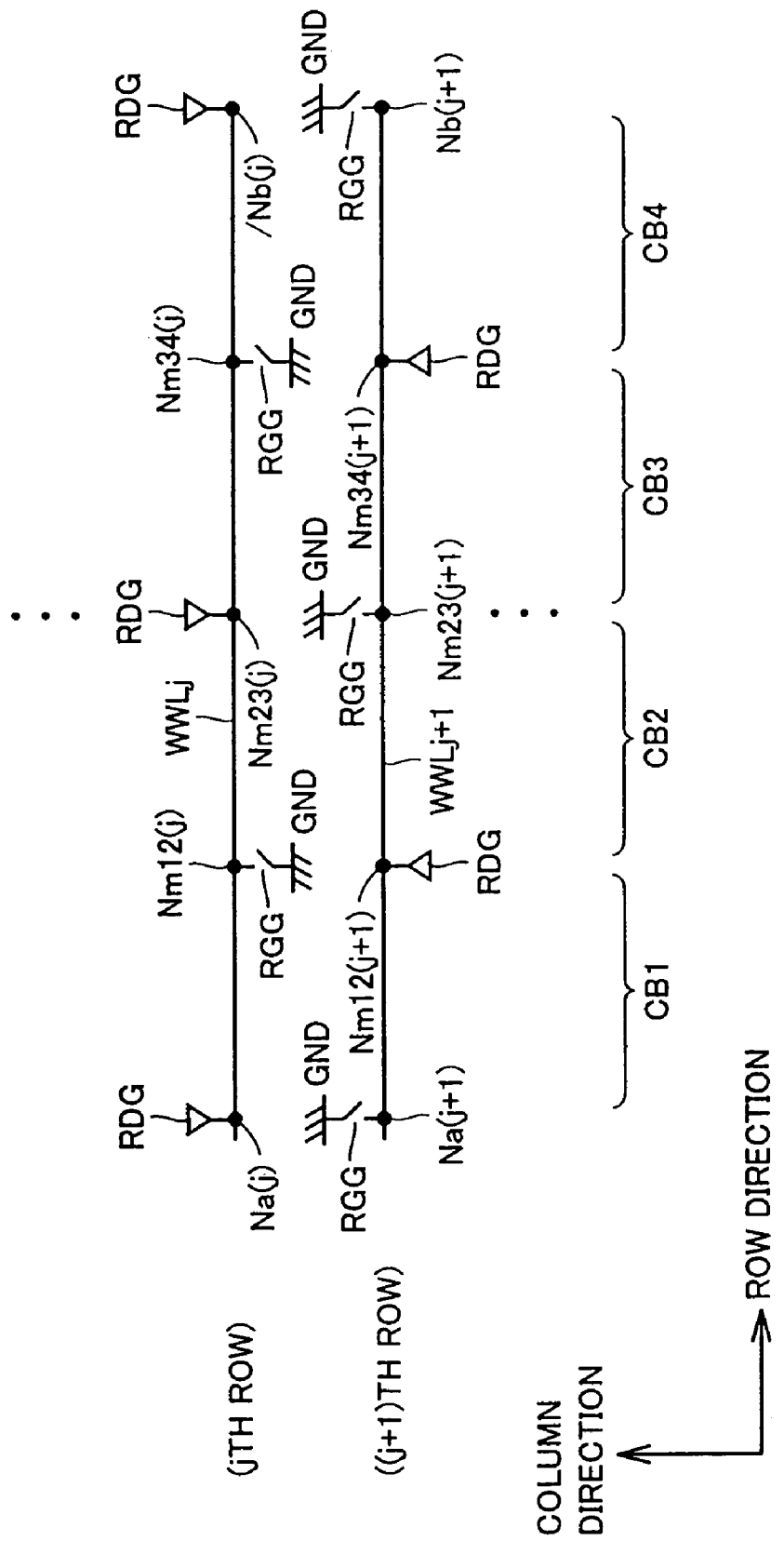
FIG. 15 shows an arrangement of drive switches according to a second modification of the fifth embodiment.

FIG. 15 conceptually shows an arrangement of drive switches according to the second modification of the fifth embodiment.

FIG. 15 shows by way of example a structure, in which memory array 10 is divided into four column blocks CB1-CB4 each extending in the column direction. In each memory cell row, write word line WWL is arranged commonly to column blocks CB1-CB4.

Similarly to the first modification of the fifth embodiment, drive switch RDG or RGG is arranged corresponding to each of nodes Na, Nm and Na, i.e., nodes Na and Nb, which correspond to the opposite ends of write word line WWL, respectively, and intermediate nodes Nm corresponding to the boundaries between two column blocks, respectively.

Drive switch RDG is provided for connecting the corresponding node to power supply voltage Vcc, and drive switch RGG is provided for connecting the corresponding node to ground voltage GND. In each memory cell row, drive switches RDG and RGG are arranged alternately and successively.

In an example of the structure shown in FIG. 15, drive switches RDG and RGG are arranged for write word line WWLj in the jth position such that drive switch RDG is arranged for node Na(j) corresponding to one end of write word line WWLj, and drive switch RGG is arranged for an intermediate node Nm12(j) corresponding to a boundary between column blocks CB1 and CB2. Further, drive switches RDG, RGG and RGD are alternately arranged for an intermediate node Nm23(j) corresponding to a boundary between column blocks CB2 and CB3, an intermediate node Nm34(j) corresponding to a boundary between column block CB3 and CB4, and a node Nb0 corresponding to the other end of write word line WWLj.

Independently of the number of column blocks, the drive switches of M (M: integer larger than two) in number arranged in the direction from node Na to node Nb in each memory cell row are configured such that each of the odd-numbered drive switches is formed of one of the drive switches RDG and RGG, and each of the even-numbered drive switches is formed of the other of drive switches RDG and RGG.

In the data write operation, drive switches RDG and RGG corresponding to the two nodes on portions of write word line WWL, which are located on the opposite sides of the selected memory cell, respectively, are turned on. Similarly to the fifth embodiment and its first modification, the data write current can flow only through the portion, which corresponds to the column block belonging to the selected memory cell, of write word line WWL in the selected row.

Owing to the above structure, the data write current can flow only through a partial section, which corresponds to the selected memory cell, of the write word line in the selected row. In the selected row, therefore, it is possible to suppress erroneous writing of data into the memory cell in the unselected memory block. Further, the path of the data write current can be short, and the electric resistance thereof can be low so that the data write operation speed can be increased, and the power consumption can be reduced. Also, the data write current can be supplied sufficiently and easily even in the low voltage operation. Further, the drive switch RDG or RGG can be shared by the neighboring column blocks so that the number of drive switches and therefore the circuit area can be reduced.

For write word line WWLj+1 in the next row (i.e., (j+1)th row), drive switches RGG, RDG, RGG, RDG and RGG are successively and alternatively arranged for node Na(j+1), intermediate node Nm12(j+1), Nm23(j+1), Nm34(j+1) and Nb(j+1), respectively.

Thus, drive switches RDG for power supply voltage Vcc and drive switches RGG for ground voltage GND are alternately arranged so that different kinds of drive switches RDG and RGG are arranged for the neighboring rows, respectively. In other words, the odd-numbered drive switches are arranged such that the drive switches in the odd-numbered memory cell rows are different in kind from those in the even-numbered rows. For example, if each of the odd-numbered drive switches in the odd-numbered rows is formed of drive switch RDG corresponding to power supply voltage Vcc, each of the odd-numbered drive switches in the even-numbered rows is formed of drive switch RGG corresponding to ground voltage GND.

Thereby, these drive switches can be arranged under loose pitch conditions, and therefore can be arranged efficiently. As a result, an area for such arrangement can be reduced. Drive switch RGG corresponding to ground voltage GND may be eliminated, similarly to the structure in FIG. 11, and corresponding intermediate node Nm may be directly coupled to ground voltage GND.

Sixth Embodiment

A sixth embodiment will now be described in connection with efficient arrangement of the bit line drivers shown in FIG. 11.

Figure 16:
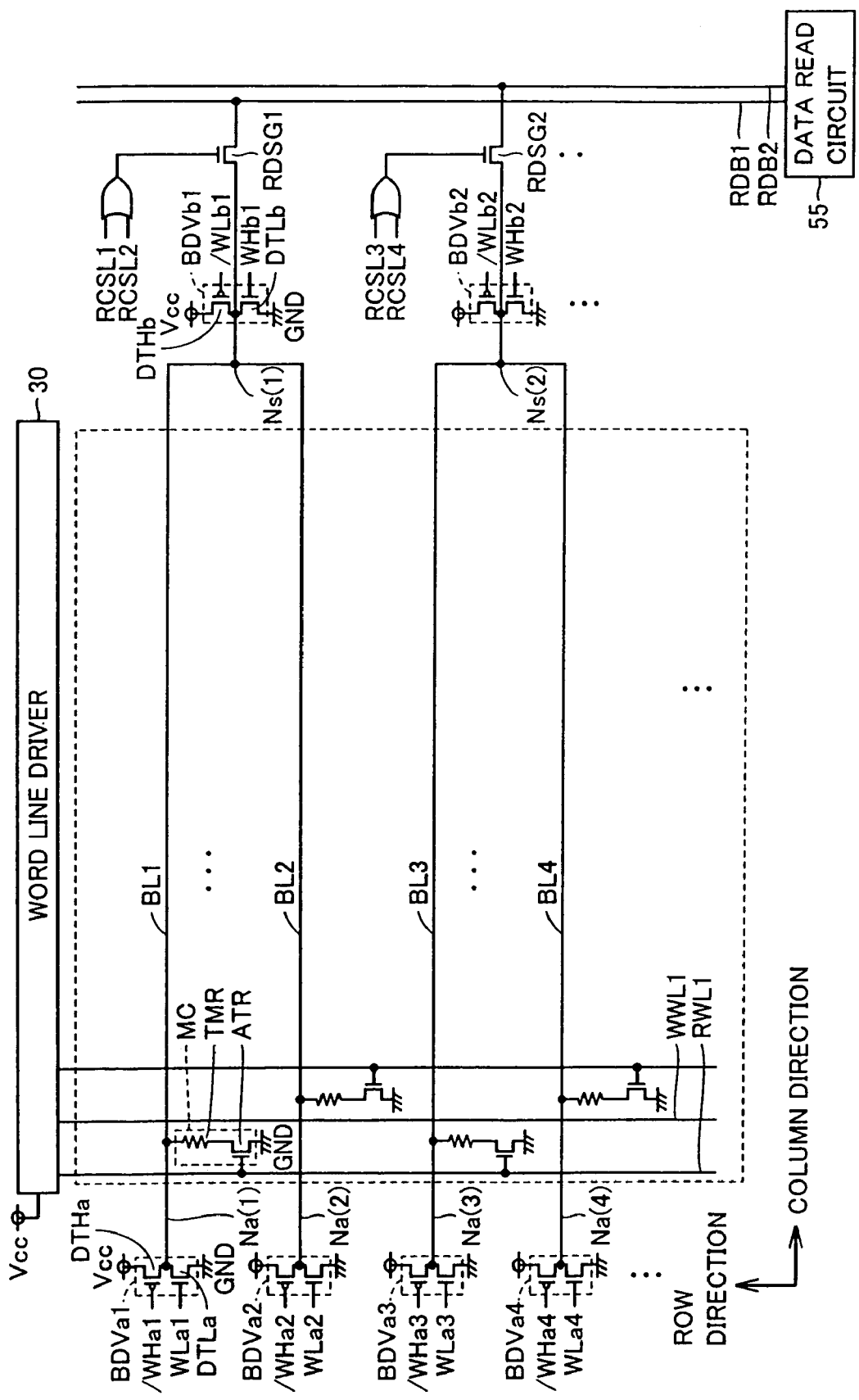
FIG. 16 is a circuit diagram showing a peripheral structure of a memory array according to a sixth embodiment.

Referring to FIG. 16, a structure according to the sixth embodiment includes bit lines BL, which are divided into a plurality of groups each including bit lines BL of X (X: integer larger than one) in number. In each group, the other end of each of the X bit lines is electrically coupled via a short-circuit node Ns. In the example shown in FIG. 16, X is equal to two.

For each bit line BL, bit line driver BDVa is arranged for driving the voltage on node Na corresponding to the one end. For example, bit line driver BDVa1 corresponding to node Na(1) is arranged for bit line BL1.

On the other end side of bit line BL, bit line driver BDVb is arranged in each group for driving the voltage on short-circuit node Ns. For example, bit line driver BDVb1 corresponding to short-circuit node Ns(1) is arranged commonly to bit lines BL1 and BL2. The structures and operations of bit line drivers BDVa and BDVb are substantially the same as those shown in FIG. 11, and therefore description thereof is not repeated.

In the data write operation, bit line driver BDVa corresponding to the selected column and bit line driver BDVb corresponding to the selected group drive corresponding nodes Na and Ns to one and the other of power supply voltage Vcc and ground voltage GND in accordance with results of the write data in response to the write control signal sent from the data write circuit (not shown). Thereby, the data write current can be passed in the direction corresponding to the write data through bit line BL in the selected column.

Read data buses RDB1 and RDB2 extend in the row direction crossing bit line BL, and are located on the other end side of bit lines BL. For respective blocks, read select gates RDSG1, RDSG2, . . . are arranged for selectively connecting read data buses RDB1 and RDB2 to short-circuit nodes Ns. Read select gates RDSG1, RDSG2, . . . are arranged on the outer side of bit line drivers BDVb.

Read select gate RDSG1, which is an example of the odd-numbered read select gates, electrically couples corresponding short-circuit node Ns(1) to read data bus RDB1 in response to activation of read column select line RCSL1 or RCSL2. Read select gate RDSG2, which is an example of the even-numbered read select gates, electrically couples corresponding short-circuit node Ns(2) to read data bus RDB2 in response to activation of read column select line RCSL3 or RCSL4.

In the data read operation, the bit line in the selected column is connected to ground voltage GND via the selected memory cell in response to activation of read word line RWL in the selected row. In this state, data read circuit 55 passes the read currents through read data buses RDB1 and RDB2, whereby the data is read from the selected memory cell by detecting the currents/voltages on read data buses RDB1 and RDB2.

In the structure according to the sixth embodiment, bit line driver BDVb in each group is shared by X bit lines BL so that the layout pitch of bit line drivers BDVb can be increased by a factor of X. By utilizing the layout pitch thus increased, read select gates RDSG1, RDSG2, . . . can be efficiently arranged on the other end side of bit lines BL. Consequently, the chip area can be reduced.

Modification of Sixth Embodiment

Figure 17:
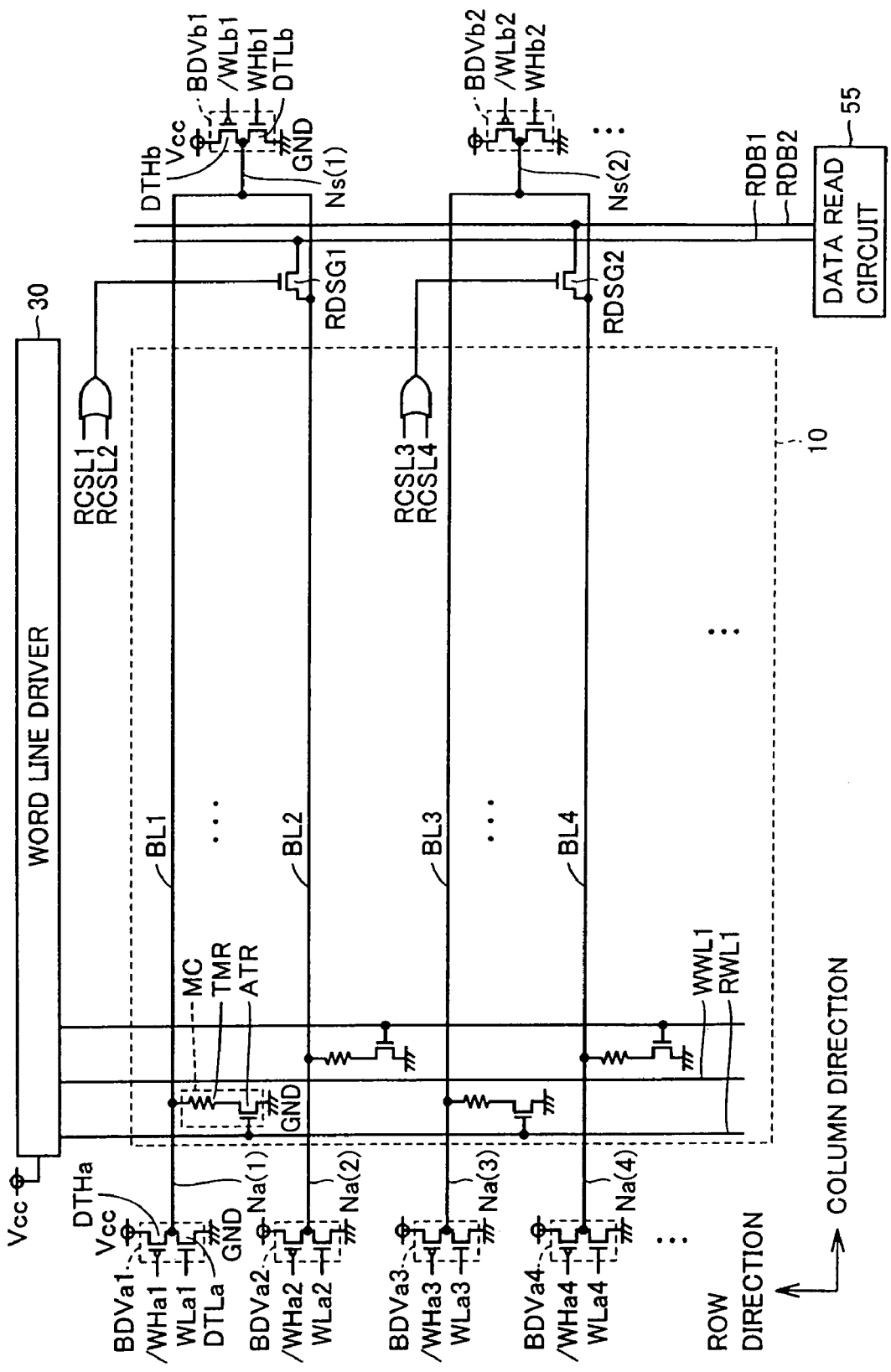
FIG. 17 is a first circuit diagram showing a peripheral structure of a memory array according to a modification of the sixth embodiment.

Referring to FIG. 17, a structure according to a modification of the sixth embodiment differs from a structure shown in FIG. 16 in that read select gates RDSG1, RDSG2, . . . are arranged on the inner side of bit line driver BDVb. Structures other than the above are substantially the same as those shown in FIG. 16, and therefore description thereof is not repeated.

By arranging the read select gates on the inner side of the bit line drivers, the bit line length in the read current path can be relatively reduced so that the electric resistance of the bit line portion can be reduced. Accordingly, the data read speed and the data read margin can be improved.

In other words, by arranging the read select gate on the outer side of the bit line driver as shown in FIG. 16, it is possible to reduce relatively the length of the data write current path, and therefore to reduce the electric resistance thereof. Accordingly, the data write speed and the power consumption can be improved.

Figure 18:
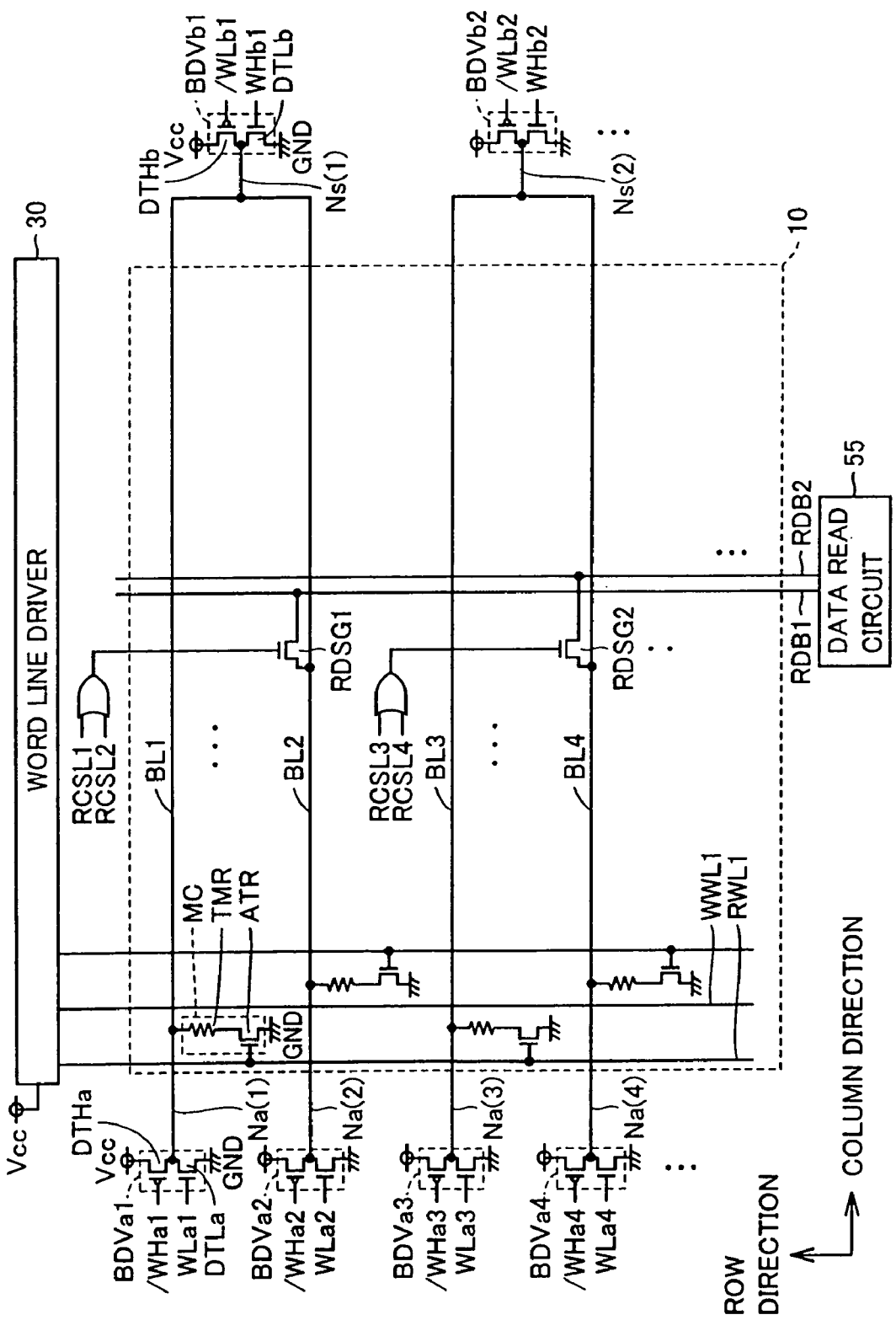
FIG. 18 is a second circuit diagram showing the peripheral structure of the memory array according to the modification of the sixth embodiment.

Alternatively, a structure shown in FIG. 18 may be employed. In this structure, read data buses RDB1 and RDB2 as well as read select gates RDSG1, RDSG2, . . . may be arranged corresponding to the intermediate points of bit lines BL.

Seventh Embodiment

A seventh embodiment will now be described in connection with a structure, in which the number of bit line drivers is reduced, and the data write current can be supplied only to a portion corresponding to the selected memory cell on the bit line BL.

Figure 19:
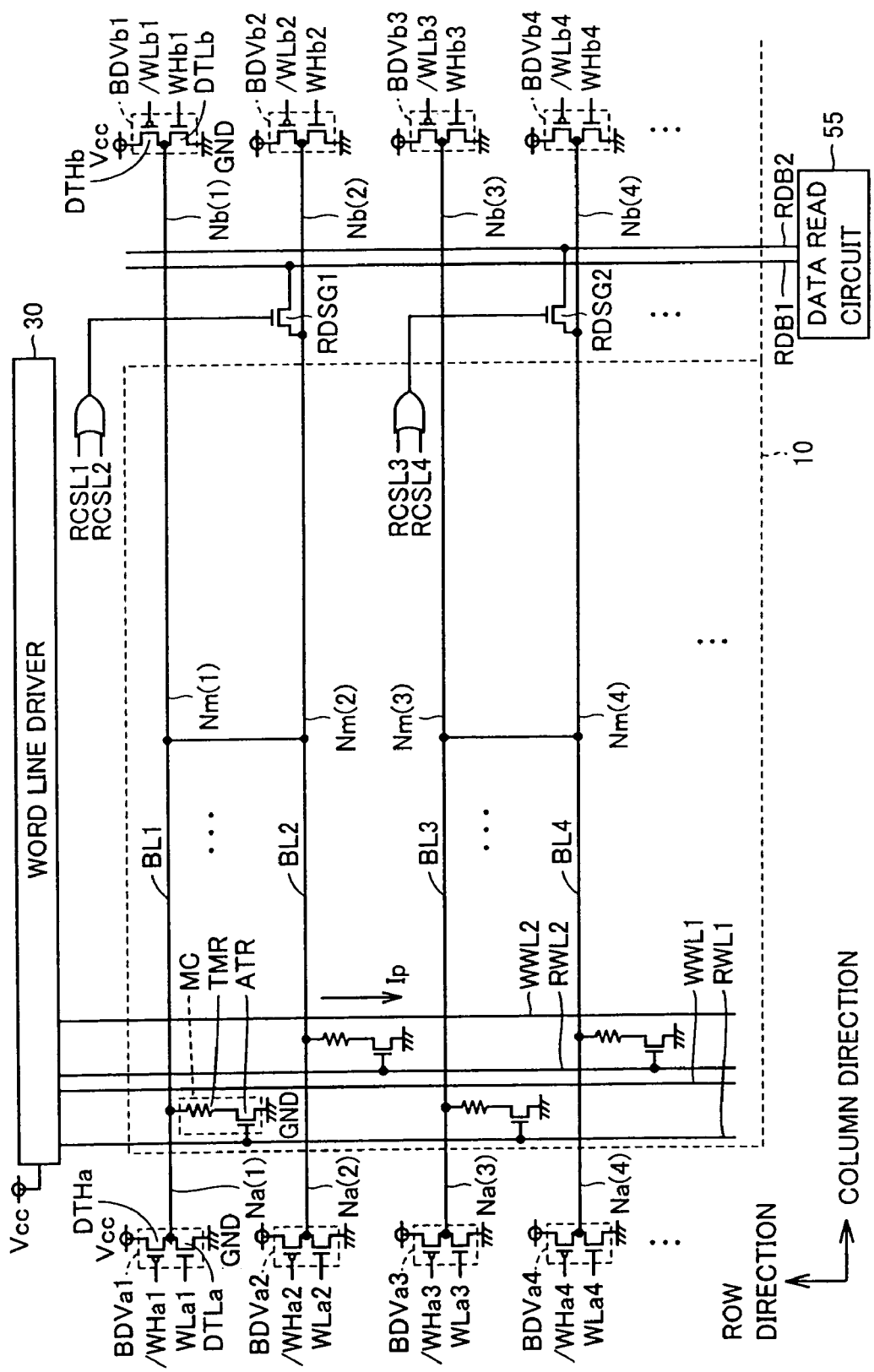
FIG. 19 is a circuit diagram showing a peripheral structure of a memory array according to a seventh embodiment.

In a structure according to the seventh embodiment shown in FIG. 19, bit lines BL are divided into a plurality of groups each including two bit lines BL, and two bit lines in each group have intermediate points (i.e., intermediate nodes Nm), which are electrically connected together. In FIG. 19, each group is formed of the two bit lines neighboring to each other.

Bit line drivers BDVa and BDVb are arranged corresponding to each bit line BL for driving voltages on nodes Na and Nb corresponding to one and the other ends of bit line BL, respectively. The structures and operations of bit line drivers BDVa and BDVb are substantially the same as those shown in FIG. 11, and therefore description thereof is not repeated.

For example, bit line driver BDVa1 corresponding to node Na(1) and bit line driver BDVb1 corresponding to node Nb(1) are arranged for bit line BL1. Further, intermediate nodes Nm(1) and Nm(2) are electrically coupled together.

In the data write operation, if the selected memory belongs to memory cell block MBa, two bit line drivers BDVa belonging to the selected block drive corresponding nodes Na to one and the other of power supply voltage Vcc and ground voltage GND according to the write data in response to the write control signal sent from the data write circuit (not shown), respectively. Two bit line drivers BDVb corresponding to the selected block drive corresponding nodes Nb to neither power supply voltage Vcc nor ground voltage GND.

Conversely, if the selected memory cell belongs to memory cell block MBb, two bit line drivers BDVb corresponding to the selected block drive corresponding nodes Nb to one and the other of power supply voltage Vcc and ground voltage GND in accordance with the write data, respectively. Two bit line drivers BDVa corresponding to the selected block drive corresponding nodes Na to neither power supply voltage Vcc nor ground voltage GND.

Consequently, the data write current can be passed in a direction corresponding to the write data only through a portion (nodes Na-Nm-Na, or nodes Nb-Nm-Nb), corresponding to the selected memory cell, of the bit line in the selected column without requiring the bit line driver arranged corresponding to the intermediate node. Therefore, an electric resistance of the path of the data write current can be reduced so that the required data write current can be supplied easily even in a low voltage operation, and a speed of the data write operation can be increased. Further, it is possible to suppress erroneous writing of data into the unselected memory cell in the selected column.

During the data write operation, bit line drivers BDVa and BDVb in the unselected group drive corresponding nodes Na and Nb to ground voltage GND for preventing flowing of an unintended current, respectively. In the operations and states other than the data write operation, bit line drivers BDVa and BDVb drive corresponding nodes Na and Nb to neither power supply voltage Vcc nor ground voltage Vss.

Read data buses RDB1 and RDB2 extend in the direction (row direction) crossing bit line BL, and are arranged corresponding to the other end side of bit lines BL. Further, read select gates RDSG1, RDSG2, . . . are provided corresponding to the respective blocks for selectively connecting corresponding read data bus RDB1 or RDB2 to one of the two bit lines. Read select gate RDSG1, which is an example of the odd-numbered read select gates, electrically couples one (BL2) of the corresponding bit lines to read data bus RDB1 in response to activation of read column select line RCSL1 or RCSL2. Read select gate RDSG2, which is an example of the even-numbered read select gates, electrically couples one (BL4) of the corresponding bit lines to read data bus RDB2 in response to activation of read column select line RCSL3 or RCSL4.

Thereby, data read circuit 55 passes the read current through read data buses RDB1 and RDB2, whereby the currents/voltages on the read data buses RDB1 and RDB2 can be detected so that the data can be read from the selected memory cell.

Modification of Seventh Embodiment

Figure 20:
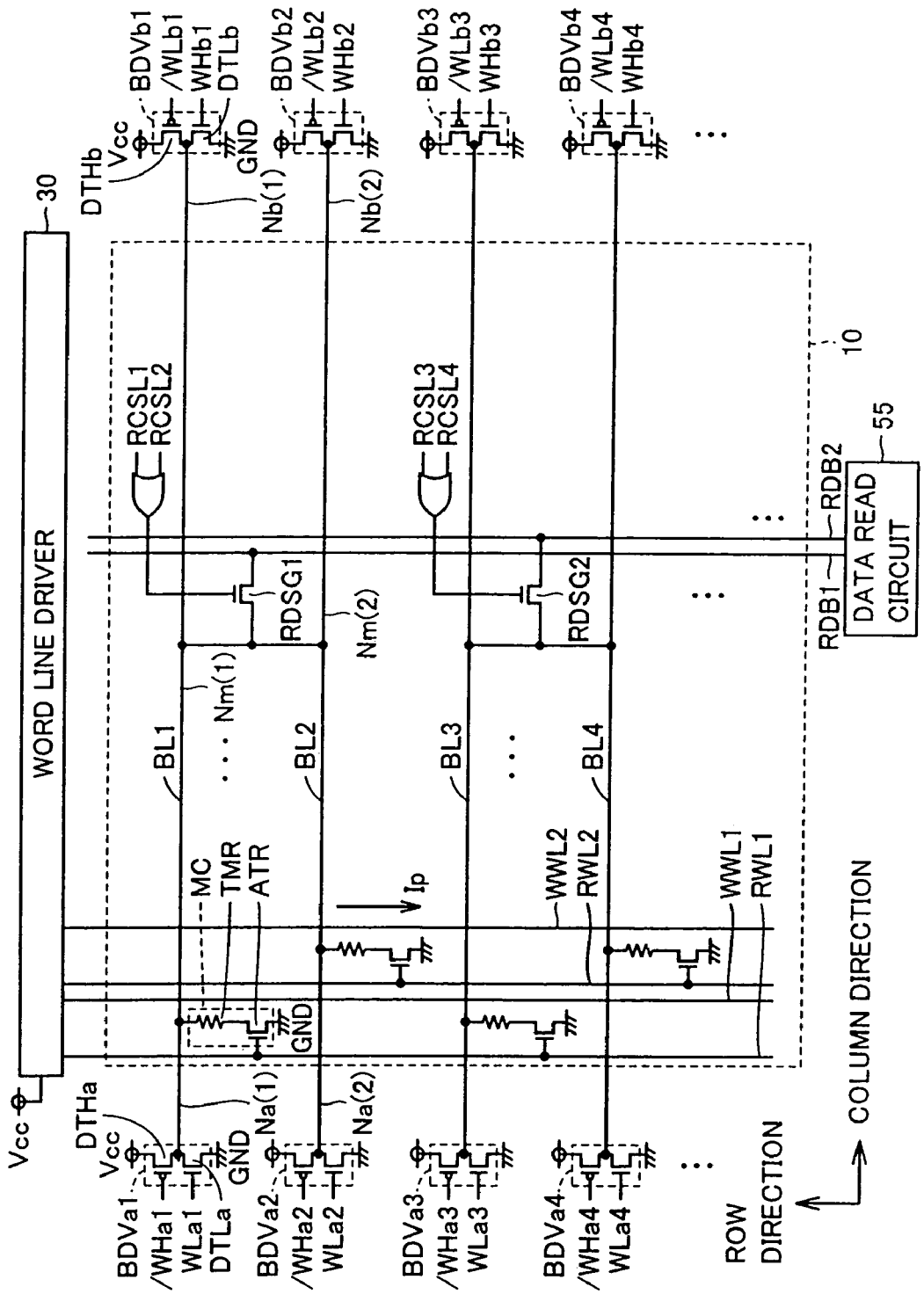
FIG. 20 is a circuit diagram showing a peripheral structure of a memory array according to a modification of the seventh embodiment.
Figure 21:
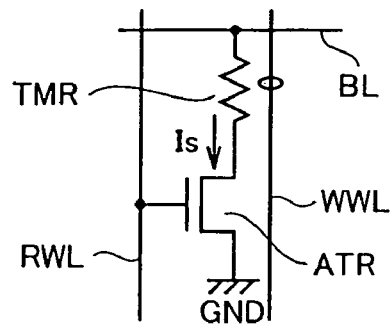
FIG. 21 schematically shows a structure of an MTJ memory cell.
Figure 22:
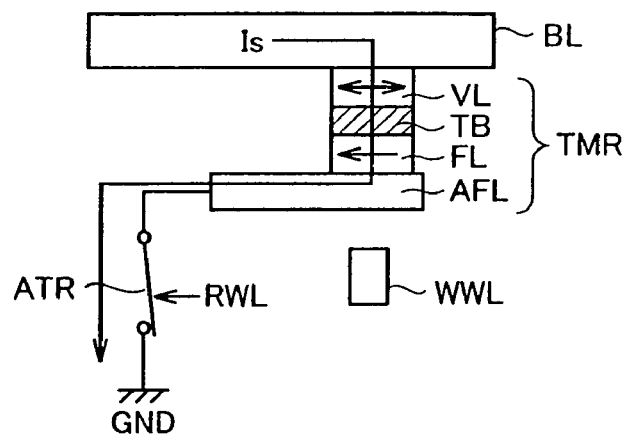
FIG. 22 conceptually shows an operation of reading data from the MTJ memory cell.
Figure 23:
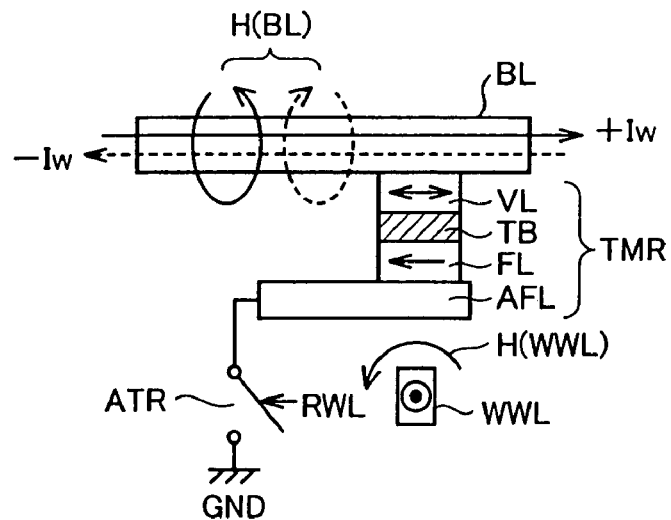
FIG. 23 conceptually shows an operation of writing data into the MTJ memory cell.
Figure 24:
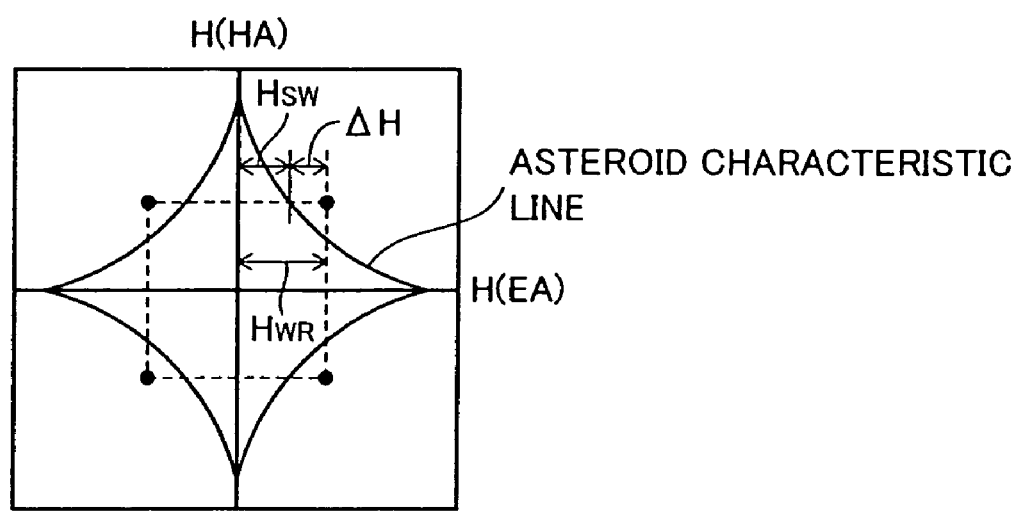
FIG. 24 conceptually shows a relationship between a data write current and a magnetization direction of a tunneling magneto-resistance element in the operation of writing data into the MTJ memory cell.

Referring to FIG. 20, a structure according to a modification of the seventh embodiment differs from the structure shown in FIG. 19 in that read data buses RDB1 and RDB2 correspond to intermediate nodes Nm of bit lines BL, and are arranged in a central region of bit lines BL. Structures other than the above are the same as those in FIG. 19, and therefore description thereof is not repeated.

Owing to the structure described above, the bit line length in the read current path can be reduced, and the electric resistance of the bit line portion can be reduced as compared with the structure shown in FIG. 19. Therefore, an effect of improving the data read speed and the data read margin can be achieved in addition to the effects achieved by the structure according to the seventh embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device comprising:
    a plurality of memory cells arranged in rows and columns, and each storing data written in response to application of first and second data write magnetic fields;
    a plurality of write word lines provided corresponding to said rows for passing, in a predetermined direction, a first data write current producing said first data write magnetic field in a selected row, respectively;
    a plurality of bit lines provided corresponding to said columns for passing, in a direction in accordance with a write data, a second data write current producing said second data write magnetic field in a selected column, respectively; and
    a plurality of current return lines arranged in the same direction as said plurality of bit lines, wherein
    each of said bit lines corresponds to one of said plurality of current return lines, and
    said second data write current flows through selected one of said bit lines corresponding to said selected column and the corresponding current return line having an end on one side electrically coupled to an end on one side of the selected bit line corresponding to said selected column.

2. The thin film magnetic memory device according to claim 1, further comprising:
a plurality of select switches provided corresponding to said columns, respectively, each for electrically coupling end portions on said one side of corresponding one of said bit lines and corresponding one of said current return lines together in accordance with results of the column selection; and
a data write circuit for setting ends on the other side of the selected bit line and the corresponding current return lines to one and the other of first and second voltages in accordance with a level of said write data, respectively.

3. The thin film magnetic memory device according to claim 1, wherein
each of said current return lines is provided for a predetermined number of said columns more than two.

4. The thin film magnetic memory device according to claim 1, wherein
said plurality of current return lines are arranged at the same interconnection layer as said plurality of bit lines.

5. The thin film magnetic memory device according to claim 1, wherein
said plurality of current return lines are arranged at an interconnection layer different from that of said plurality of bit lines.

* * * * *